United States Patent
Ominami et al.

(10) Patent No.: US 9,824,854 B2
(45) Date of Patent: Nov. 21, 2017

(54) CHARGED PARTICLE BEAM DEVICE, IMAGE GENERATION METHOD, OBSERVATION SYSTEM

(71) Applicant: HITACHI HIGH-TECHNOLOGIES CORPORATION, Tokyo (JP)

(72) Inventors: Yusuke Ominami, Tokyo (JP); Junichi Katane, Tokyo (JP); Shinsuke Kawanishi, Tokyo (JP); Sukehiro Ito, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/109,481

(22) PCT Filed: Dec. 24, 2014

(86) PCT No.: PCT/JP2014/084019
§ 371 (c)(1),
(2) Date: Jul. 1, 2016

(87) PCT Pub. No.: WO2015/118785
PCT Pub. Date: Aug. 13, 2015

(65) Prior Publication Data
US 2016/0329188 A1    Nov. 10, 2016

(30) Foreign Application Priority Data
Feb. 6, 2014    (JP) .................. 2014-020904

(51) Int. Cl.
*G01N 23/00*    (2006.01)
*H01J 37/28*    (2006.01)
(Continued)

(52) U.S. Cl.
CPC ............. *H01J 37/28* (2013.01); *H01J 37/18* (2013.01); *H01J 37/226* (2013.01);
(Continued)

(58) Field of Classification Search
CPC .. H01J 37/00; H01J 37/02; H01J 37/22; H01J 37/222; H01J 37/24; H01J 37/244; H01J 37/26; H01J 37/28
(Continued)

(56) References Cited

U.S. PATENT DOCUMENTS 4,588,891 A * 5/1986 Saito ............... H01J 37/265
                                                250/310
6,476,390 B1 * 11/2002 Murakoshi ........ G01N 23/225
                                                250/306
(Continued)

FOREIGN PATENT DOCUMENTS

CN      102308357 A      1/2012
JP      10-283978 A      10/1998

OTHER PUBLICATIONS

International Search Report of PCT/JP2014/084019 dated Feb. 3, 2015.
(Continued)

*Primary Examiner* — Jason McCormack
(74) *Attorney, Agent, or Firm* — Mattingly & Malur, PC

(57) ABSTRACT

Provided is a charged particle beam device capable of observing the interior and the surface of a sample in a simple manner. This charged particle beam device operates in a transmitted charged particle image mode and a secondary charged particle image mode. In the transmitted charged particle image mode, a transmitted charged particle image is produced on the basis of a detection signal (512) associated with light emitted from a light-emitting member (500) that emits light upon being irradiated with transmitted charged particles transmitted through the interior of a sample (6). In the secondary charged particle image mode, a secondary charged particle image is produced on the basis of a detec-
(Continued)

tion signal (518) caused by reflected charged particles or secondary charged particles (517) from the sample (6).

18 Claims, 15 Drawing Sheets

(51) Int. Cl.
*H01J 37/244* (2006.01)
*H01J 37/18* (2006.01)
*H01J 37/22* (2006.01)

(52) U.S. Cl.
CPC ..... *H01J 37/244* (2013.01); *H01J 2237/2448* (2013.01); *H01J 2237/24455* (2013.01); *H01J 2237/2608* (2013.01)

(58) Field of Classification Search
USPC .............................. 250/306, 307, 311, 310
See application file for complete search history.

(56) References Cited

U.S. PATENT DOCUMENTS

| | | | | |
|---|---|---|---|---|
| 2004/0238752 | A1* | 12/2004 | Tanba | H01J 37/244 250/396 R |
| 2010/0102248 | A1* | 4/2010 | Milas | H01J 37/20 250/440.11 |
| 2011/0291010 | A1* | 12/2011 | Katane | H01J 37/244 250/310 |

OTHER PUBLICATIONS

Chinese Office Action received in corresponding Chinese Application No. 201480073481.7 dated Feb. 27, 2017.

\* cited by examiner

CHARGED PARTICLE BEAM DEVICE, IMAGE GENERATION METHOD, OBSERVATION SYSTEM

TECHNICAL FIELD

The present invention relates to a charged particle beam device that can observe an interior and a surface of a sample, an image acquisition method using the device, and an observation system.

BACKGROUND ART

To observe an interior structure of a minute area of an object, a scanning transmission electron microscope (STEM), a transmission electron microscope (TEM), or the like is used. As a typical method of observing an interior of a sample using such an electron microscope, arranging the sample sliced thinly to be able to transmit an electron beam, on a mesh-like sample table including a large number of holes, and acquiring a transmitted electron beam by a detector arranged at an opposite side to an electron source side with respect to a sample surface is known. However, in this method, the sample floats on the holes of the mesh, and thus work to mount the sample on the sample table is extremely difficult. Therefore, PTL 1 has proposed an electron detector that allows an observation sample to be directly placed.

Further, the minute area of an object can be observed only by the electron microscope but also by an optical microscope. By use of the optical microscope, color information, which cannot be acquired by the electron microscope in principle, can be acquired. The optical microscope can acquire a transmitted optical image by irradiating the sample with white light or specific light and focusing light having the color information absorbed in the sample or emitted from the sample. Accordingly, for example, by putting a specific dyeing material into a biological cell sample, only a specific area in a cell can be dyed. Therefore, which area is dyed or not dyed can be observed by observing the color. Especially, the optical microscope is widely used in pathological diagnosis or in the field of life science.

While the electron microscope cannot acquire the color information, the electron microscope can observe the minute area with high resolution, which cannot be observed by the optical microscope. Further, information obtained from the electron microscopic image is information that reflects a difference in density of the sample, and is different from information obtained by the optical microscope.

CITATION LIST

Patent Literature

PTL 1: JP H10-283978 A

SUMMARY OF INVENTION

Technical Problem

The detector and sample table of PTL 1 has the sample directly arranged on an electrical system electrically wired with a semiconductor, a metal film, and the like. Since the wiring is connected, the detector and sample table requires troublesome work to remove the electrical wiring to observe the same sample by another device. Further, for example, to observe a cultured cell or the like that requires the sample itself to be cultivated on the sample table for microscopic observation, a circuit connected with the electrical wiring needs to be immersed in a culture solution or the like, so that placement of the sample on the detector and sample table may become difficult. As described above, the conventional technology takes a lot of trouble to install and take out the sample in the observation with the transmitted charged particle.

Further, typically, the electron microscope can acquire an image having information of a surface and a form of the sample by secondary charged particles such as secondary electrons and reflection electrons. However, as described above, the installation and taking out of the sample for observation with the transmitted charged particle takes a lot of trouble. Therefore, conventional devices are very inconvenient to observe both of the image by the transmitted charged particle and the image by the secondary charged particles.

The present invention has been made in view of the foregoing, and an objective is to provide a charged particle beam device that can easily and simply observe an interior and a surface of a sample, an image acquisition method using the device, and an observation system.

Solution to Problem

To solve the above problem, a charged particle beam device of the present invention is operated in a transmitted charged particle image mode to generate a transmitted charged particle image based on a detection signal of light from a light-emitting member that emits light by being irradiated with a transmitted charged particle having been transmitted through an interior of a sample, and in a secondary charged particle image mode to generate a secondary charged particle image based on a detection signal caused by a secondary charge particle or a reflection charged particle from the sample.

Advantageous Effects of Invention

According to the present invention, by causing a sample table on which a sample is placed to emit light, and detecting the emitted light, image observation by a transmitted charged particle can be easily and simply performed. Especially, both of an interior and a surface of the sample can be easily and simply observed.

Problems, configurations, and effects other than those described above will become clear by description of following embodiments.

DESCRIPTION OF EMBODIMENTS

Figure 1:
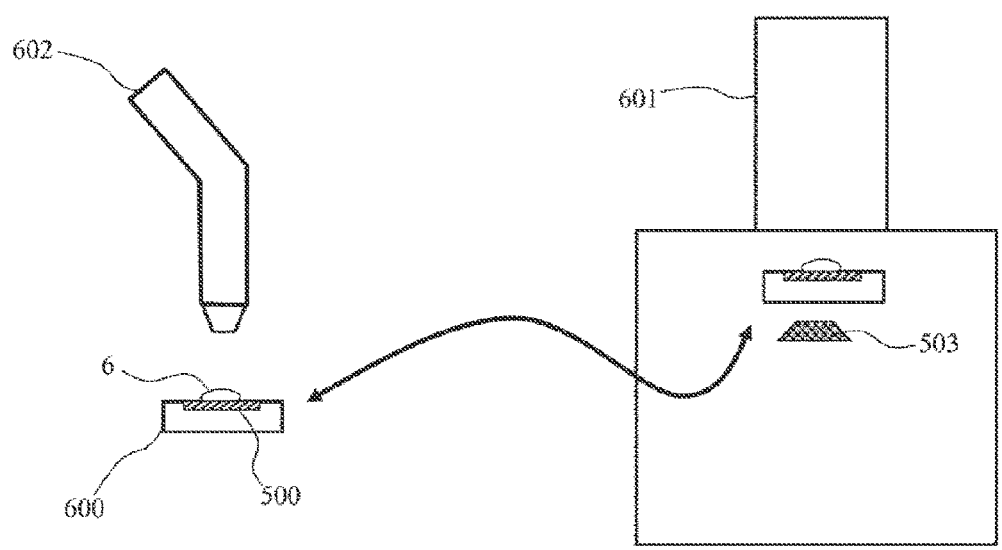
FIG. 1 is a schematic explanatory diagram of optical microscopic observation and charged particle beam microscopic observation.

Hereinafter, embodiments will be described using the drawings.

Hereinafter, details of a sample table and a charged particle beam device to which the sample table is applied in the present invention will be described. Note that this is a mere example of the present invention, and the present invention is not limited by the embodiments to be described below. The present invention is also applicable to a device that observes a sample by irradiating the sample with a charged particle beam, for example, a scanning electron microscope, a scanning ion microscope, a scanning transmission electron microscope, a complexed device of the aforementioned microscopes and a sample processing device, and analysis/inspection devices to which the aforementioned devices are applied. Note that the sample table and the charged particle beam device where the sample table is placed in the present invention configure an observation system that can observe a transmitted charged particle beam image.

Further, in the present specification, "atmospheric pressure" is an air atmosphere or a predetermined gas atmosphere, and means a pressure environment in the atmospheric pressure or in a slightly negative pressure state. To be specific, the "atmospheric pressure" is about $10^5$ Pa (atmospheric pressure) to $10^3$ Pa.

Further, in the present specification, "sample table" means a unit that can be removed from the charged particle beam device together with the sample in a state where the sample is placed. To be specific, as described below, the "sample table" unit may include a light-emitting member and a base, or may be formed of only the light-emitting member.

First Embodiment

<Outline>

First, an outline of the present embodiment will be described. In the present embodiment, a charged particle microscope and an observation system that can acquire an image (transmitted charged particle beam image) by transmitted charged particles and an image (secondary charged particle image) by reflection charged particles and secondary charged particles will be described. Especially, in the present embodiment, description will be given, where the transmitted charged particle beam image and the secondary charged particle beam image are generated based on signals from the same detector. Further, as a specific embodiment in the present embodiment, an example will be described, in which a charged particle beam transmitted through or scattered in an interior of a sample is converted into light and the light is detected, so that an image by the transmitted charged particle is generated. However, an embodiment is not limited to the example.

In the present embodiment, to be more specific, at least a part of a sample table where the sample is placed is formed of a light-emitting member that emits light by being irradiated with the charged particle beam. The light-emitting member is irradiated with the charged particle beam transmitted through or scattered in the sample on the light-emitting member, and the light is generated. The light is detected by a detector included in the charged particle microscope, so that the transmitted charged particle beam image is generated. That is, in the present embodiment, the charged particle beam transmitted through the sample is not directly detected, and is converted into light and the light is detected. As details will be described below, the light-emitting member that converts the charged particle beam into the light does not require a power source cable connected from an outside and wiring such as a signal line. Therefore, observation can be performed by the charged particle beam microscope and another device using the same sample table, and troublesome work to remove electric wiring when the sample is moved between the devices is not necessary. Further, the light-emitting element itself or the sample table including the light-emitting member can be easily attached to/detached from the device. Therefore, a sample of any type can be easily set to the sample table. Especially, it is very effective to observe a cultured cell or the like that requires the sample itself to be cultivated on the sample table for microscopic observation.

Figure 2:
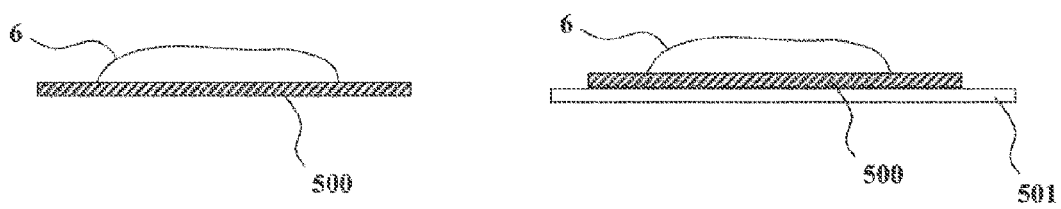
FIG. 2 is a detailed diagram of a sample table provided with a detection element.

Further, by use of the sample table of the present invention as illustrated in FIG. 1, observation by the charged particle beam microscope and observation by another device such as the optical microscope can be performed with the same sample table. FIG. 1 illustrates a sample table 600 provided with a detection element 500 (also referred to as light-emitting member) that can convert or amplify the charged particle beam in the present embodiment into light and emit the light, a charged particle beam microscope 601, and an optical microscope 602. A sample 6 can be mounted on the sample table 600. Note that the detection element is not limited to those including an electrical circuit or a mechanical circuit, and widely means a principal element member having a function to detect the charged particle beam. For example, the detection element may refer to the light-emitting member itself, as described below. In reality, the detection element can detect the charged particle beam as an electrical signal by being operated in combination with a detection system such as a detector and an amplifier included in the charged particle beam microscope. Therefore, the detection element can also be referred to as a part of the detection system. Further, as illustrated in FIG. 2, the detection element 500 itself may serve as the sample table 600. In this case, the detection element 500 and the sample table 600 are synonymous.

In the present embodiment, the detection element provided with the sample table may be favorably created with a transparent member. Hereinafter, the "transparent" means capable of transmitting visible light, ultraviolet light, or infrared light in specific wavelength ranges or in all of wavelength ranges. The wavelength ranges refer to the wavelength of about 10 to 400 nm for the ultraviolet light, the wavelength of about 380 to 750 nm for the visible light, and the wavelength of about 700 nm to 1 mm (=1000 μm) for the infrared light. For example, when light can be seen through even if one or more colors are mixed, the visible light in a specific wavelength range is transmissible. If the light is colorless and transparent, the visible light in all of the wavelength ranges is transmissible. Here, "transmissible" refers to passage of light with a light amount that enables at least optical microscopic observation with the light in the wavelength ranges (for example, 50% of transmittance or more is desirable). Further, here, the specific wavelength range is a wavelength range including at least a wavelength range to be used for observation of an optical microscope. Therefore, the optical microscope can be used for a typical optical microscope (transmission optical microscope) that can detect a "light transmission signal", which is obtained such that the light from one surface side of the sample table of the present embodiment is transmitted through the sample, from another surface side of the sample table. As the optical microscope, any microscope using light can be employed, such as a biological microscope, a stereoscopic microscope, an inverted microscope, a metal microscope, a fluorescence microscope, or a laser microscope. Further, here, for description, "microscope" is employed. However, the present invention can be generally applied to devices that acquire information by irradiating a sample with light, regardless of a magnification ratio of an image.

In the present embodiment, a transmitted charged particle microscopic image can be acquired by detecting, by the detection element provided in the sample table, a "charged particle transmission signal", which is obtained such that the sample 6 is irradiated with the charged particle beam generated in the charged particle beam microscope, and then the charged particle beam is transmitted through or scattered in the interior of the sample. As described below, a photodetector 503 is included in the charged particle beam microscope 601 for converting and amplifying the light from the detection element 500 into the light.

Further, obtained information is different between the electron microscope and the optical microscope, and thus in recent years, a demand to observe the same sample by both of the electron microscope and the optical microscope has been increasing. However, for example, the detector and sample table of PTL 1 cannot transmit the light, and is a sample table for electron microscope that cannot perform observation by an optical microscope. Therefore, a sample for electron microscope and a sample for optical microscope need to be separately prepared, and there is a problem that preparation of the sample takes the trouble.

The sample table of the present embodiment can be mounted on the charged particle beam microscope such as the electron microscope, and thus can serve as a common sample table shared by the optical microscope. That is, by moving the same sample table between the microscopes and observing the sample, as illustrated by the arrow in FIG. 1, the charged particle beam observation and the optical observation are possible while the sample remains arranged on the same sample table without preparing a plurality of samples for observation by the respective microscopes and moving the samples. Note that the same sample table may be mounted in each of the microscopes individually arranged as illustrated in FIG. 1, or a complexed microscope device in which the optical microscope and the charged particle microscope are integrated, as described below, may be used. Hereinafter, details of the sample table, a sample mounting method, an image acquisition principle, a device configuration, and the like will be described.

<Description of Sample Table>

Details of the sample table in the present embodiment will be described using FIG. 2. The sample table of the present embodiment is configured from the detection element 500 that converts the charged particle beam into the light. Alternatively, the sample table is configured from a base 501 (may also be referred to as transparent member when the member is transparent) that supports the detection element 500. When the observation by the optical microscope and the observation by the charged particle microscope are performed with the same sample table, the detection element 500 and the base 501 are desirably transparent. The sample 6 is directly mounted on the detection element 500. Alternatively, the sample 6 may be indirectly mounted through a member such as a film described below. The base 501 is ideally colorless and transparent. However, one or more colors may be mixed. Examples of the base 501 include transparent glass, transparent plastic, and transparent crystal substance. When observation is performed by a fluorescence microscope or the like, it is better not to absorb the fluorescence light, and thus plastic is favorable. In the sample table of the present embodiment, the optical microscopic observation is possible as long as at least the detection element and the base 501, which exist between a portion where the sample is arranged and a surface facing the portion where the sample is arranged in the sample table, are "transparent". Note that the base 501 is not necessarily provided.

The detection element 500 is an element that detects the charged particle beam coming flying with energy of several to several tens of keV, and emits light such as visible light, ultraviolet light, or infrared light when being irradiated with the charged particle beam. When the detection element 500 is used for the sample table of the present embodiment, the detection element converts the charged particles, which have been transmitted through or scattered in the interior of the sample placed on the sample table, into light. The wavelength of the emitted light may just be a specific or arbitrary wavelength range of the visible light, the ultraviolet light, and the infrared light. As the detection element, a scintillator, a luminescence light emission material, or the like can be used. As examples of the scintillator include inorganic scintillator materials such as silicon nitride (SiN), an yttrium-aluminum-garnet (YAG) element, an yttrium-aluminum-perovskite (YAP) element, a bismuth germanium oxide (BGO) element, a gadolinium silicon oxide (GSO) element, a lutetium silicon oxide (LSO) element, an yttrium silicon oxide (YSO) element, a lutetium yttrium silicon oxide (LYSO) element, and a thallium activation sodium iodide (NaI (TI)) element. Alternatively, a plastic scintillator containing a material that can emit light such as polyethylene terephthalate, an organic scintillator, a material on which a liquid scintillator containing anthracene is applied may be employed. The detection element 500 may be any material as long as the material is an element that can convert the charged particle beam into the light.

In a case where the detection element 500 is polycrystalline substance, light emission amounts are different between a crystal portion is irradiated with the charged particle beam and a boundary of crystals is irradiated with the charged particle beam. As a result, a particle boundary of the crystals is observed. If information of the particle boundary of the crystals and sample interior information are mixed, clear sample transmission observation may not be able to be performed. Therefore, a particle diameter (size) of the crystal needs to be sufficiently smaller than the size of the sample to be observed, or the particle diameter of the crystal needs to be sufficiently larger than the size of the sample of to be observed. In a case where the particle boundary of the crystals becomes an obstacle in the transmission observation regardless of the particle diameter of the crystal, it is favorable that the detection element 500 uses single crystal substance. When the sample is arranged on the single crystal substance and irradiated with the charged particle beam, observation of only the sample interior information can be conducted without observing the particle boundary of the crystals. However, in a case of using the single crystal substance for the detection element 500, if the sample mounted on the detection element 500 is observed by the optical microscope, the light may be split into two when the light passes through the single crystal substance. As a result, an object to be observed may be seen double in the result of the observation of the optical microscope. This happens due to a double refraction phenomenon caused by the single crystal. Therefore, in a case where the single crystal substance is used for the detection element 500, and the sample placed on the detection element is observed by the optical microscope, it is necessary to control the light not to be separated due to passage of the light through the interior of the detection element 500, the light having been transmitted through the sample. For example, as described below, it is necessary to position a side where the sample is arranged and a side where a light source is arranged at an opposite side to each other with respect to the detection element 500.

Further, as another example, the detection element 500 may be a thin film or fine particles obtained by coating the base 501 with a fluorescence agent that generates fluorescence light by being irradiated with the charged particle beam. In this case, the thin film or the fine particles that are the fluorescence agent serve as the detection element 500. For example, as a coating material, there is a fluorescence protein such as green fluorescence protein (GFP). The color of the fluorescence light is not limited to green, and may be blue or red. Especially, GFP that is not instantly deteriorated when being irradiated with the charged particle beam is favorable. For example, high sensitive green fluorescence protein (enhanced GFP, EGFP), or the like is favorable. In a case where the sample to be observed is an biological sample such as a cell, there is an advantage that adhesion of the GFP as protein and the cell sample is favorable. Further, observation may be performed after enhancing the intensity of the fluorescence light of the GFP by irradiating a substrate on which the GFP is applied with the charged particle beam after mounting the sample, or the sample may be mounted after enhancing the intensity of the light emission of the GFP by irradiating the sample with the charged particle beams before mounting the sample. In this case, the coating material is supported by, applied on, or sprayed over the base 501. In the present embodiment, members that generate the light by receiving the charged particles on the light-receiving surface, in addition to the aforementioned examples of the detection element 500, are collectively referred to as light-emitting members. The mean free path in solids of the charged particle beam depends on an acceleration voltage of the charged particle beam, and is about several tens of nm to several tens of μm. Therefore, a light emission area on an upper surface of the detection element 500 becomes an area with a nearly equal thickness from the surface of the detection element. Therefore, the thickness of the detection element 500 may just exceed the mean free path in solids. Meanwhile, as described above, in a case of performing the optical microscopic observation with the same sample table, the light transmission signal of when the observation is performed by the optical microscope needs to be as transmissible as possible. Therefore, the detection element where one or more colors are mixed is favorably as thin as possible.

If the fluorescence agent as the detection element 500 is damaged by irradiation of the charged particle beam and emits less light, the damage can be prevented by cooling. In that case, a sample stage that can cool the detection element 500 with water, liquid nitrogen, or a Peltier element may just be provided.

In a case where the optical microscope 602 is a fluorescence microscope, a fluorescence material needs to be put into the sample. In this case, it is desirable that a wavelength band of the fluorescence light of the fluorescence material put into the sample and a wavelength band of the light emission of the fluorescence material as the light-emitting member in the present embodiment are shifted. For example, when the detection element 500 is coated with the green fluorescence protein, it is desirable to dye the sample with red or blue fluorescence light protein. If the coating of the light-emitting member and dyeing of the sample are performed with the same color, difference in the intensity of the light emission may just be identified, instead of the color, under the fluorescence microscope. Further, when the fluorescence material is contained in the sample, the photodetector 503 in the charged particle beam device detects the light from the detection element 500 and the light from the sample, regardless of the color. In this case, if a detector with a different amplification rate of the wavelength of light emission (a spectrometer) is used as the photodetector 503 in advance, the photodetector 503 can acquire the transmission information by the charged particles, as a result. To be specific, by use of the photodetector 503 with the amplification rate to the light from the light-emitting member, which is higher than the amplification rate to the light from the sample, the transmission signal by the charged particles can be selectively amplified. Further, a spectrometer that can separate wavelengths of light may be provided in the photodetector 503. Further, a lens may be arranged between the photodetector 503 and the detection element 500, and the light from the detection element 500 may be enlarged and directly observed. In this case, the light is directly detected with a human eye, instead of the photodetector 503.

As the sample table favorably used for the optical microscope, there is a transparent sample table such as a microscope slide (or a preparation), or a dish (or a Petri dish). That is, if the sample table provided with the detection element 500 in the present embodiment, which can convert the charged particle beam into the light, is placed on the shape of a general microscope slide (for example, about 25 mm×75 mm×1.2 mm) for optical microscope, the operation of the sample table, the mounting of the sample, and the observation of the sample can be performed with an experience or feeling of use that the user has experienced in the past. Alternatively, the sample table may be obtained by forming the sample table itself with the above-described member that emits light, such as the microscope slide or the Petri dish. According to this configuration, a way to use to primarily screen the sample with the optical microscope, and observe the selected sample with the charged particle microscope in detail can be employed. Alternatively, preparation of the sample for general high-performance transmission charged particle beam microscope device requires a great effort. Therefore, observation with the sample table in the present embodiment can be used as screening before the high-performance transmission charged particle beam microscopic observation. Further, as described below, if position information and the like are shared as a map on a computer or a paper surface when the sample is moved between the microscopes, the same portion can be observed in the microscopes.

Figure 3:
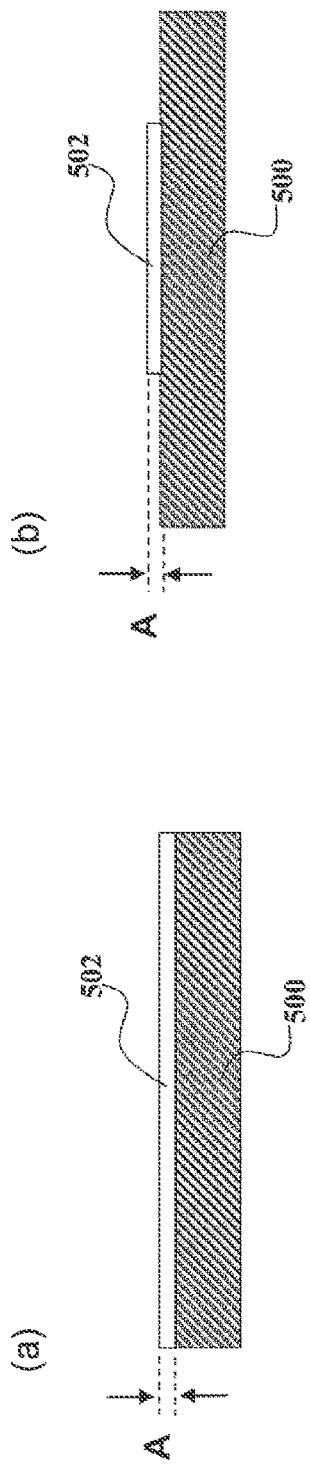
FIGS. 3(a) and 3(b) are detailed diagrams of the sample table provided with the detection element.

FIG. 3(a) illustrates another embodiment of a sample table 600. In FIG. 3(a), a thin film 502 is arranged on a surface of a detection element 500, and a sample is placed on the film 502. As described above, the mean free path in solids of the charged particle beam depends on an acceleration voltage of the charged particle beam, and is about several tens of nm to several tens of μm. Therefore, the thickness of the film 502 may just be sufficiently thinner than the mean free path. This thickness is illustrated by A in FIG. 3(a). This thin film 502 needs to have a thickness and the quality of material that can transmit a part of the charged particle beam. In a case where observation with an optical microscope is conducted, this thin film 502 needs to be transparent for light. If such a thin film 502 is arranged, dirt or damage on a surface of the detection element 500 can be prevented. An example of the thin film 502 includes substance for enhancing adhesion of the sample and the sample table so that the sample and the sample table are not separated. For example, in a case where the sample is a biological sample such as a cell, the cell surface is in a negatively charged state by phospholipid in a lipid bilayer. Therefore, molecules in a positively charged state (lysine or aminosilane) are applied on the sample table such as a microscope slide, so that the cell sample can be prevented from being separated from the sample table. Further, a material having hydrophilicity may be applied so that a sample containing a large amount of liquids can be easily mounted. Further, a material having a high affinity with a biological sample such as collagen may be applied so that living cells and bacteria can be easily mounted or cultivated. Note that the application here widely includes methods of causing the coating material to adhere to the surface of the sample table, such as spraying, immersion, and coating.

Further, as illustrated in FIG. 3(b), the above-described molecules or film for coating may be arranged only on a predetermined position. Here, the predetermined position means a partial area of the detection element 500. For example, in a case where the biological sample such as a cell is observed using the sample table where the molecules in the positively charged state are arranged only on the predetermined position, the sample can be arranged only in the predetermined position. For example, the present technique is useful when shortening an observation time by narrowing an area to be observed. Further, a conductive member (anti-static member) may be provided on at least the surface where the sample is placed, in place of or in addition to the film 502, so that charging cannot occur when the sample is irradiated with the charged particle beam. Examples of the conductive member include a carbon material, a metal material, indium tin oxide (ITO), or a conductive organic substance. Note that there may be a plurality of layers of the films.

Figure 4:
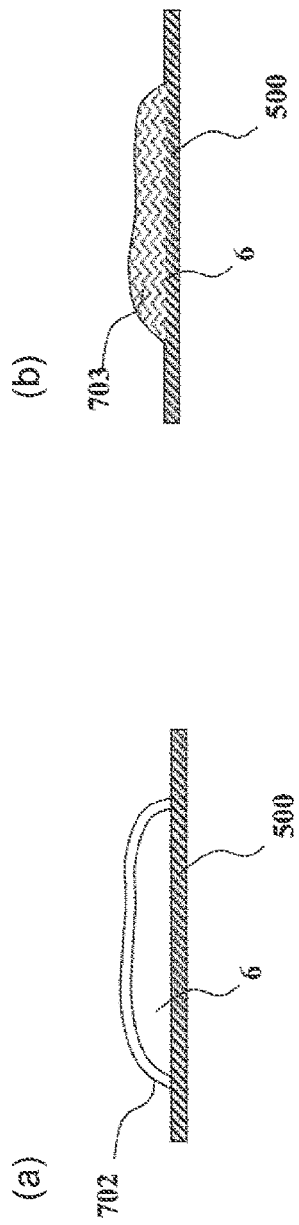
FIGS. 4(a) and 4(b) are detailed diagrams of the sample table provided with the detection element.

Further, as illustrated in FIG. 4(a), in a case of placing a water-containing sample, a thin film 702 may be arranged to surround the sample. The thin film 702 is, for example, a surfactant or organic substance. By encircling the sample to surround the sample surface with the thin film 702, moisture loss from the sample and change of the shape of the sample can be prevented.

Further, as illustrated in FIG. 4(b), substitute substance 703 may be introduced into an interior or a periphery of the sample. The substitute substance 703 is, for example, organic substance such as an ionic liquid. The ionic liquid has a characteristic to provide conductivity to an electron irradiation surface. By arranging the ionic liquid in the interior or the periphery of the sample, the sample can be prevented from being charged when the sample is irradiated with the charged particle beam in vacuum. Further, by replacing the moisture contained in the sample with the ionic liquid, the form of the sample can be maintained even if arranged in a vacuum sample chamber. By irradiating the sample containing the ionic liquid with the charged particle beam, and detecting light emission by the charged particle beam transmitted through or scattered in the sample, a transmission image of a wetter sample can be acquired. As a method of attaching or introducing the ionic liquid into the sample, the sample may be impregnated into the ionic liquid, or the ionic liquid may be sprayed over the sample with a spray or the like.

<Sample Mounting Method>

A method of mounting the sample on the sample table will be described below. The sample needs to be thin so that the charged particle beam (as well as light when the optical microscopic observation is also performed) should be transmitted. For example, the sample has a thickness of about several nm to several tens of μm. Examples of the sample that can be directly mounted on the detection element 500 include a liquid or a mucous membrane including cells, a liquid biological specimen such as blood or urine, a segmented cell, particles in a liquid, fine particles such as bacteria, fungi, or viruses, and a soft material containing the fine particles or the organic substance. As the method of mounting the sample, following methods can be considered, other than the above-described cultivation. For example, there is a method of dispersing the sample in a liquid, and attaching the liquid to the detection element. Further, the sample may be segmented to have a thickness to transmit the charged particle beam, and the segmented sample may be arranged on the detection element. To be more specific, the sample is attached to a tip of a cotton swab, and the sample attached on the tip may be smeared on the detector, or the sample may be dropped with a dropper. In a case of the fine particles, the fine particles may be sprinkled on the detector. The fine particles may be applied with a spray. Further, a spin coating method of rotating the liquid at a high speed and applying the liquid over the sample table, or a dip coating method of putting the sample table in the liquid and lifting up the sample table to apply the liquid may be used. Any method can be employed as long as the thickness of the sample can be about several nm to several tens of μm.

Figure 5:
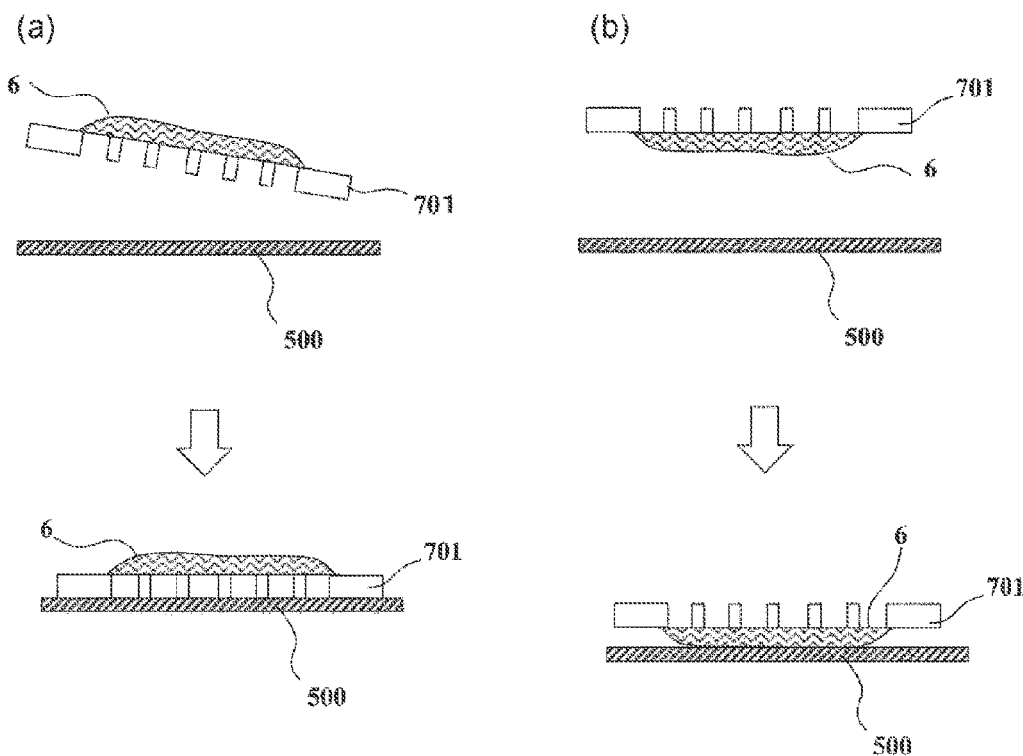
FIGS. 5(a) and 5(b) are detailed diagrams of the sample table provided with the detection element.

Alternatively, a sample 6 having the thickness of about several nm to several tens of μm may be mounted on a base 701 in advance, as illustrated in FIGS. 5(a) and 5(b), and the base 701 on which the sample 6 is held may be mounted on a detection element 500. In this case, the base 701 can be considered as a part of a sample. In this case, the base 701 as a part of the sample may be brought in contact with the detection element 500, as illustrated in FIG. 5(a), or the sample 6 may be brought in contact with the detection element 500, as illustrated in FIG. 5(b). The base 701 is a mesh-like or stripe-like base, and the thickness is about several μm to several mm. A transmission image in the present embodiment can be acquired regardless of the thickness of the base 701.

<Interior Observation Principle>

Figure 6:
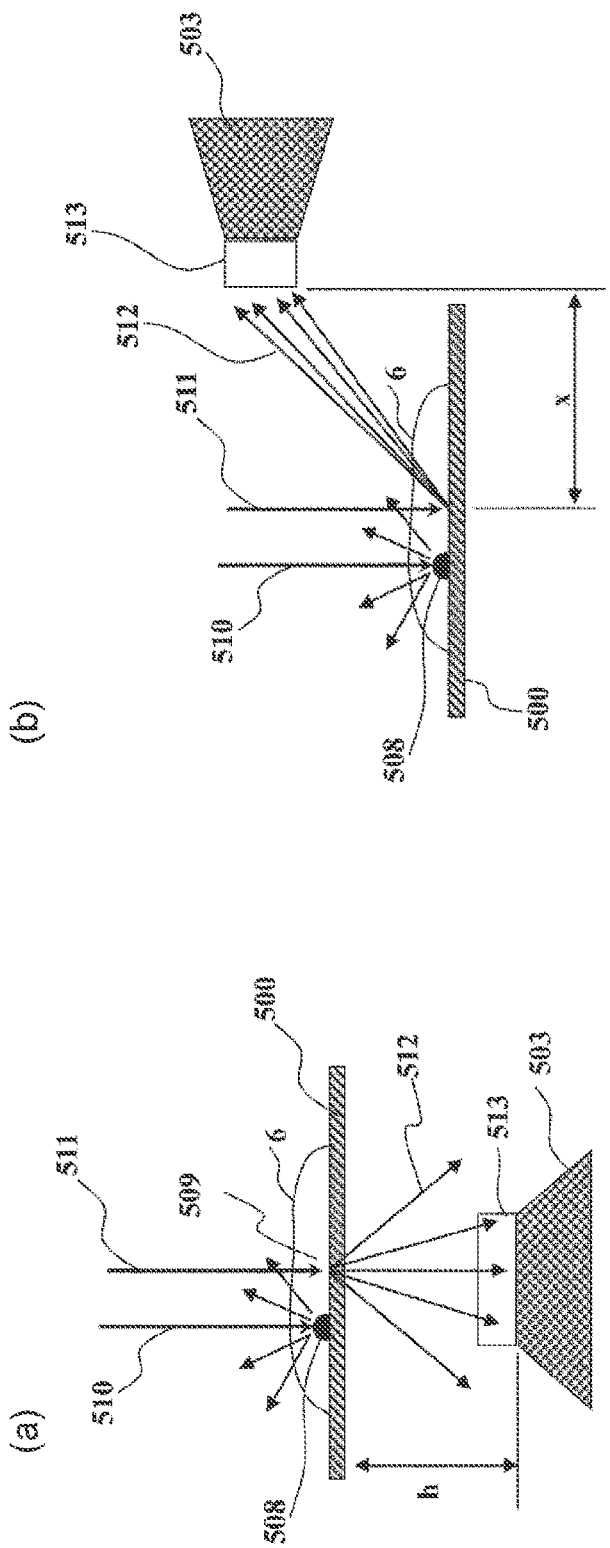
FIGS. 6(a) and 6(b) are explanatory diagrams for detecting a transmitted charged particle from the detection element.

Hereinafter, a method of detecting the sample table using the sample table of the present embodiment and a principle that enables acquisition of the transmitted charged particle beam will be described. FIGS. 6(a) and 6(b) illustrate states in which the sample 6 is arranged on the detection element 500. The photodetector 503 is illustrated around the sample table. The photodetector 503 can convert or amplify an optical signal from the detection element 500 into an electrical signal. The converted or amplified electrical signal is input to a control unit or a computer through a communication line, and is imaged by the aforementioned control system. The acquired image (transmitted charged particle beam image) may be displayed on a monitor or the like.

Here, consider a case in which the sample includes a portion with high density 508 and a portion with low density 509. In a case where the portion with high density 508 is irradiated with a primary charged particle beam 510 in the sample, a large majority of the charged particle beam is back-scattered, and thus the charged particle beam does not reach the detection element 500. Meanwhile, in a case where the portion with low density 509 is irradiated with a primary charged particle beam 511 in the sample, the charged particle beam reaches the detection element 500, and can emit light. As a result, a density difference of the interior of the sample can be detected (that is, converted into an optical signal with intensity according to the density difference) in the detection element 500. This degree of transmission is changed according to acceleration energy of the charged particle beam. Therefore, by changing the acceleration energy of the charged particle beam, information of the interior to be observed and an area of the observation can be changed.

FIG. 6(a) illustrates an example in which the photodetector 503 is arranged below the detection element 500 as the sample table. There may be a space between the photodetector 503 and the sample table (the h portion in FIG. 6(a)). To detect the light as efficiently as possible, the distance (distance h) between the photodetector 503 and the sample table is favorably as short as possible. Further, an optical observation system such as an optical lens and a mirror may be arranged between the photodetector 503 and the sample table, and the light may be collected. Further, an optical transmission member 513 may be arranged between the photodetector 503 and the sample table. The optical transmission member 513 is a member that is transparent for a wavelength range of the light caused from the detection element 500, and transmits the light of the detection element 500 in a direction of the photodetector 503. The optical transmission member 513 is a transparent or semitransparent material for the light, such as quartz, glass, light fiber, or plastic. With this configuration, the photodetector 503 can be arranged separated from the sample stage, and thus wiring and an electrical circuit connected to the photodetector 503 can be arranged in positions separated from the sample table or the sample stage that holds the sample table. The space between the photodetector 503 and the sample table may be in an air atmosphere or in a vacuum state. In any case, the space between the photodetector 503 and the sample table needs to transmit the wavelength ranges of the light emission as many as possible.

FIG. 6(b) illustrates an example in which the photodetector 503 is arranged above the upper surface of the sample table 500. In this case, the principle to detect the emitted light is similar to the above description. The distance (the x portion in FIG. 6(b)) between the photodetector 503 and the light emission portion is favorably as close as possible. Meanwhile, a charged particle optical barrel and the like are disposed above the sample 6, and thus it may be difficult to arrange the photodetector 503 close to the sample table. In such a case, the above-described optical transmission member 513 may be arranged between the photodetector 503 and the detection element 500. For example, the shape of the optical transmission member 513 can be more freely processed than the photodetector 503 and thus can be formed as narrow as possible, and can be arranged close to the sample 6. With this configuration, the photodetector 503 can be arranged completely separated from the detection element 500 where the sample 6 is arranged. Note that a drive mechanism may be provided to the illustrated photodetector 500 or optical transmission member 513, and the photodetector 500 or the optical transmission member 513 may be moved. If the photodetector 500 or the optical transmission member 513 can be moved, the sample stage can be prevented from coming in contact with the photodetector 503 or the optical transmission member 513 when the position or angle of the sample stage is changed.

<Observation Procedure>

Figure 7:
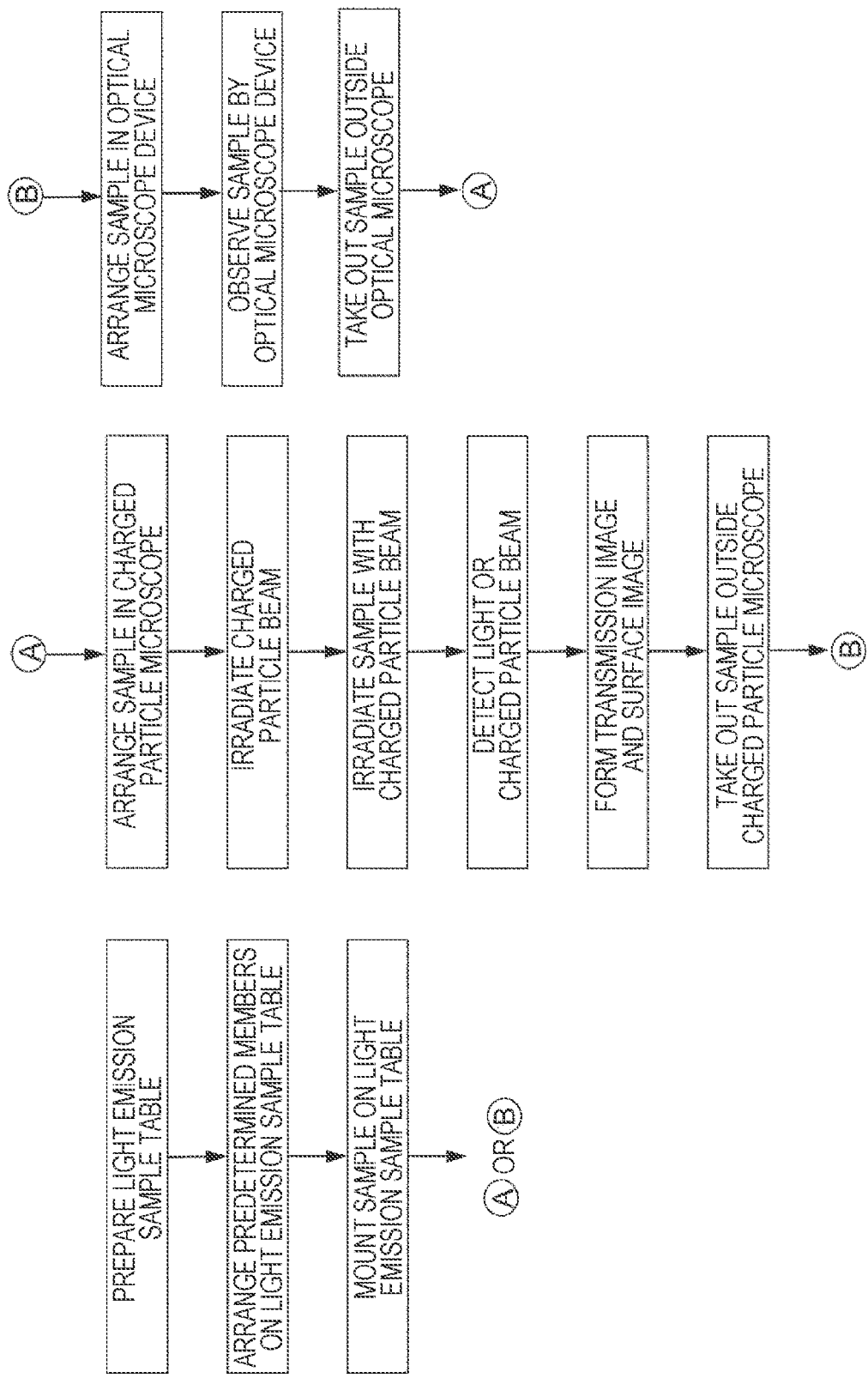
FIG. 7 is an observation procedure in a charged particle beam microscope and an optical microscope.

A procedure example of microscopic observation will be described using FIG. 7. First, the detection element 500 (light emission sample table) for mounting the sample is prepared. Next, predetermined members are arranged on the detection element 500, as needed. Here, the predetermined members are, as described above, the substance for enhancing the adhesion of the sample and the sample table, the conductive substance, the substance for reflecting the light, and a predetermined gas material of some sort. If arrangement of the predetermined members is not necessary, the present step is unnecessary. Next, the sample is mounted on the detection element 500.

Next, the procedure is moved into a step of mounting the detection element to the charged particle microscope or the optical microscope and performing observation. Step A is a step of performing observation in the charged particle microscope, and Step B is a step of performing observation in the optical microscope. In step A, first, the detection element 500 on which the sample is mounted is arranged in the charged particle microscope device. Next, by irradiating the sample with the charged particle beam, the charged particle beam is transmitted or scattered. Next, when the charged particle has reached the detection element 500, the light is emitted. Therefore, this light emission is detected by the photodetector. Alternatively, a secondary charged particle such as a secondary charged particle beam or a reflection charged particle beam emitted from the sample is detected. As described below, light generated by a gas scintillation phenomenon may be detected using a gas existing near the sample. Next, a charged particle image that has reflected the surface and the transmission information of the sample is generated, based on a signal detected by the detector, in a control unit or an image processing unit included in the charged particle microscope. When the observation by the charged particle microscope device is terminated, the sample is taken out of the charged particle microscope device. The procedure is moved onto the observation step B by the optical microscope, as needed. In the observation step B by the optical microscope, first, the detection element 500 on which the sample is mounted is arranged in the optical microscope device. As described above, if the sample needs to have the shape of a microscope slide when arranged in the optical microscope device, the detection element 500 can be placed on the microscope slide. Next, the observation is performed in the optical microscope. When the observation is terminated, the sample may be put back to the charged particle microscope device and the observation may be performed again. Steps A and B may be switched with each other, or may be performed at the same time in a case where the charged particle microscope device and the optical microscope device are integrated.

<Photodetector>

Figure 8:
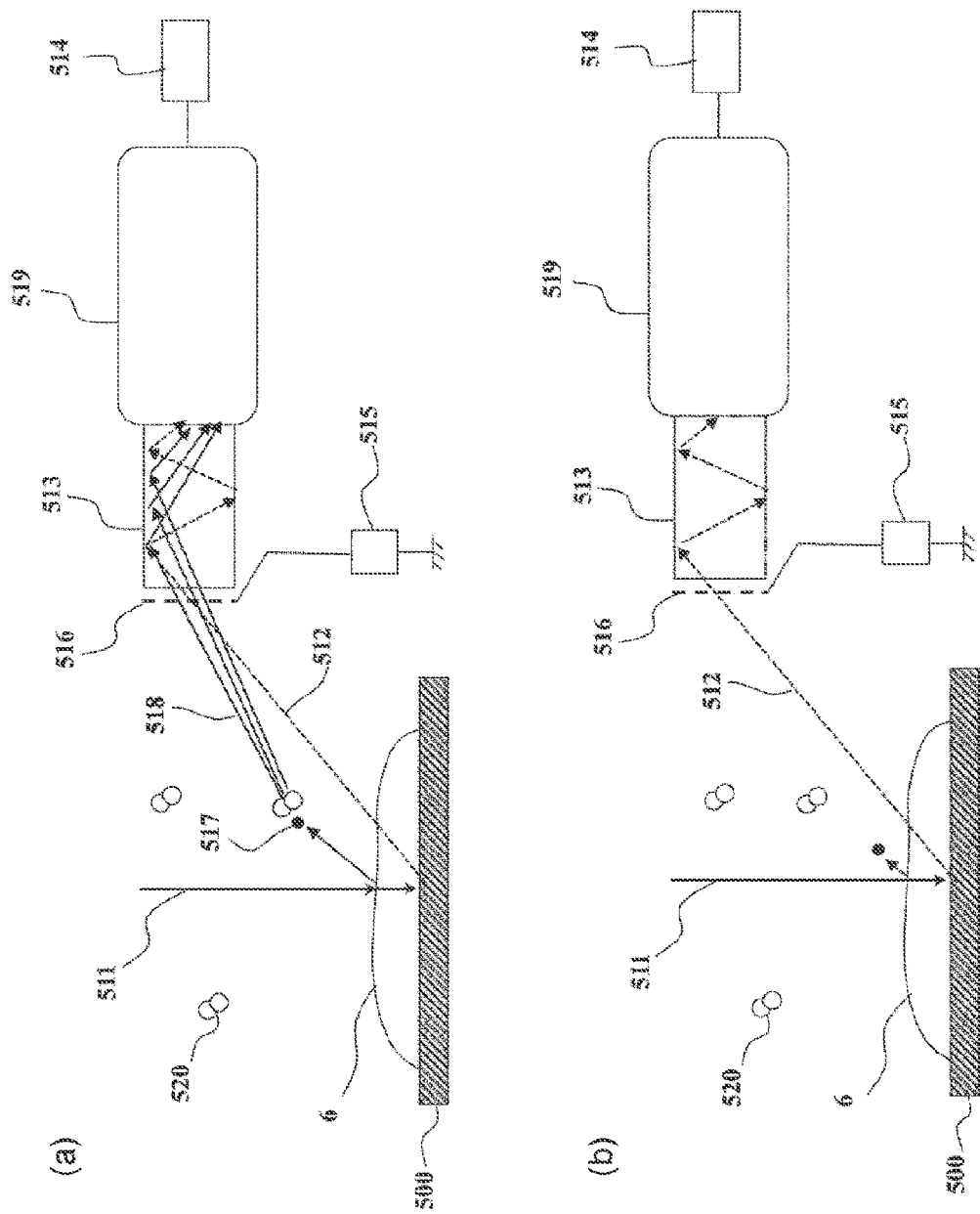
FIGS. 8(a) and 8(b) are explanatory diagrams for detecting the transmitted charged particle from the detection element.

Next, a configuration of the photodetector that can observe the sample interior and the sample surface using the above-described principle will be described in detail using FIGS. 8(a) and 8(b). The photodetector of the present embodiment can observe the sample interior and the sample surface with one detector, as described below. Here, one detector means that the detector is configured as one member. For example, a semiconductor detection element in which a plurality of detection surfaces that detect the light is manufactured at the same time, a multi-channel plate including a large number of portions that amplify the light, and the like are hereinafter regarded as one detectors because these are detachable/attachable as one members even if these include a plurality of detection portions.

Further, hereinafter, the sample surface refers to an escape depth from which the secondary charged particle or the reflection charged particle generated when the primary charged particle beam enters the sample can come out to the sample surface. For example, when the acceleration voltage of the primary charged particle beam is 15 kV, the sample surface of when detecting the secondary charged particle beam is about several tens of nm that is the escape depth, and the sample surface of when detecting the reflection charged particle beam is about several hundreds of nm or less that is the escape depth.

FIG. 8(a) illustrates a case of observing the sample surface and FIG. 8(b) illustrates a case of observing the sample interior. The photodetector 503 detects an optical signal from the sample. The photodetector 503 is configured from an optical transmission member 513 that can transmit the wavelength range of the light emission, an electrode 516 that can form an electric field between the sample 6 and the optical transmission member 513, and an optical amplifier 519 that can amplify the light. Further, an amplifier 514 for amplifying an output signal is connected to the optical amplifier 519, and a power source 515 that can apply a voltage is connected to the electrode 516. The electrode 516 has a structure that can pass the light and can be applied a voltage. For example, the electrode 516 is a net-like metal mesh. The electrode 516 may include a portion that vertically or horizontally passes the light like a slit. Further, in the present embodiment, an inside of the sample chamber is in a low vacuum atmosphere, and a gas molecule 520 exists near the sample.

FIG. 8(a) illustrates an example of detecting the secondary charged particle having information of the sample surface, such as electrons. In FIG. 8(a), an electric field is formed between the sample 6 and the optical transmission member 513 in front of the detector. To be specific, by applying a voltage from the power source 515 to the electrode 516, the electric field is caused between the sample and the detector. If there is the electric field between the sample 6 and the electrode 516, the secondary charged particle emitted from the sample and the gas molecule 520 existing between the sample 6 and the electrode 516 collide with each other, and a light emission phenomenon of gas scintillation is caused. For example, in a case where the device interior is in the low vacuum atmosphere (about 1 to 3000 Pa), a secondary charged particle 517 is generated from the sample 6 irradiated with the primary charged particle beam 511. The secondary charged particle 517 is attracted to the electrode 516 arranged above the sample, and repeats the collision with the gas molecule 520 near the sample. Accordingly, energy is given to the gas molecule, and the gas molecule is transitioned from a base state (stabled atom/molecule state) to an excited state (unstable atom/molecule state). In returning from the unstable excited state to the base state, light having light energy corresponding to transition energy transitioned to the excited state is generated. This light emission process is caused by the secondary charged particle, the light is light (ultraviolet light/visible light) 518 having sample surface information. This light 518 reaches the optical amplifier 519 through the optical transmission member 513. The signal amplified in the optical amplifier 519 is sent to the amplifier 514, and an image is then displayed based on the signal. Note that the optical transmission member 513 has performance that can sufficiently transmit the light from a vacuum ultraviolet region to a visible range. Further, the optical amplifier 519 also has performance that can convert/amplify the light from the vacuum ultraviolet range to the visible range into photoelectrons. In the case of the present configuration, the light from the detection element 500 is also detected. However, the light emission of the gas scintillation can be made extremely larger than the light from the detection element 500 by the electric field between the sample 6 and the electrode 516. Therefore, the light from the detection element 500 can be ignored. As a result, the information of the secondary charged particle emitted from the sample surface can be mainly taken out, and the sample surface image (also referred to as secondary charged particle image) can be generated.

Meanwhile, FIG. 8(b) illustrates an example of converting the transmitted charged particle having information of an interior structure of the sample into the light in the detection element as described above, and detecting the light emission from the detection element by the photodetector. In FIG. 8(b), the voltage of the electrode 516 is set to be smaller than the voltage applied in the state of FIG. 8(a) so that the light emission phenomenon of the gas scintillation does not occur. To be more specific, the voltage of the electrode 516 may just be made smaller than a threshold at which the gas scintillation is caused. In this case, the electric field between the sample 6 and the electrode 516 is small, and thus the secondary charged particle 517 generated from the sample is not accelerated, and the light due to the collision with the gas molecule 520 is not caused. Therefore, only light 512 generated from the detection element 500 by being transmitted through the sample 6 is detected by the optical amplifier 514. That is, in this case, the transmitted charged particles are indirectly detected. As a result, the signal having the information of the interior structure of the sample is output from the photodetector 503, and the transmission image (transmitted charged particle image) of the sample is generated based on the signal.

By switching the control modes of the photodetector respectively illustrated in FIGS. 8(a) and 8(b), the optical signal caused by the secondary charged particle, which indicates the surface information of the sample, and the optical signal caused by the transmitted charged particle, which indicates the information of the interior structure of the sample, can be switched and detected. In this case, what is controlled is only the value of the voltage applied to the electrode 516. Therefore, by adding only the function to change the parameter of the voltage, the sample interior and the sample surface can be observed by the same photodetector 503. In other words, by use of the detector 500 described in the present embodiment, the above-described function can be realized without substantially rearranging an existing device.

Further, according to this method, the transmitted charged particle image and the secondary charged particle image can be acquired without moving the stage to change the position and the angle. Accordingly, the same sample can be observed in the same field of vision or at the same angle. Therefore, comparison of the transmitted charged particle image and the secondary charged particle image can be easily performed.

Figure 9:
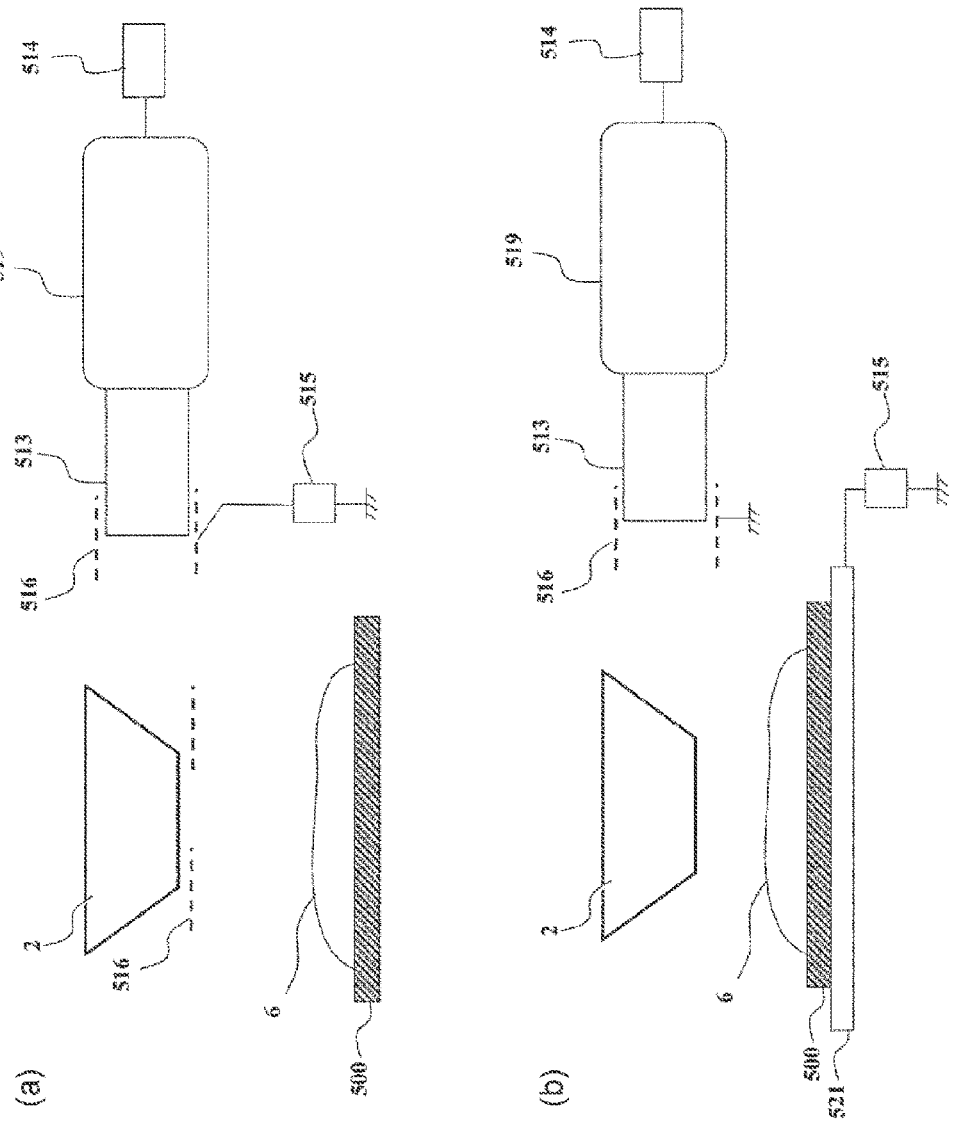
FIGS. 9(a) and 9(b) are explanatory diagrams for detecting the transmitted charged particle from the detection element.

Note that the electric field by the electrode 516 may just be formed between the sample and the photodetector, and the position of the electrode 516 is not limited to the above example. For example, FIGS. 8(a) and 8(b) illustrates that the electrode 516 is arranged immediately in front of the optical transmission member 513. However, the electrode 516 and the optical transmission member 513 may be in contact or may be slightly separated. Further, as illustrated in FIG. 9(a), the electrode 516 may be located in a periphery of a side surface of the optical transmission member 513, or may be located below a charged particle optical barrel 2, other than in the periphery of the optical transmission member 513. Alternatively, as illustrated in FIG. 9(b), the power source 515 may be connected to a table that supports the detection element 500 and the electric field may be formed around the detection element 500 and the sample 6. In this case, the electrode 516 in the periphery of the optical transmission member 513 needs to be grounded. The configuration of FIGS. 9(a) and 9(b) has a characteristic that the light emission 518 due to the gas scintillation and the light emission 512 from the detection element 500 are not interrupted by the electrode 516.

<Switching of Degree of Vacuum>

Figure 10:
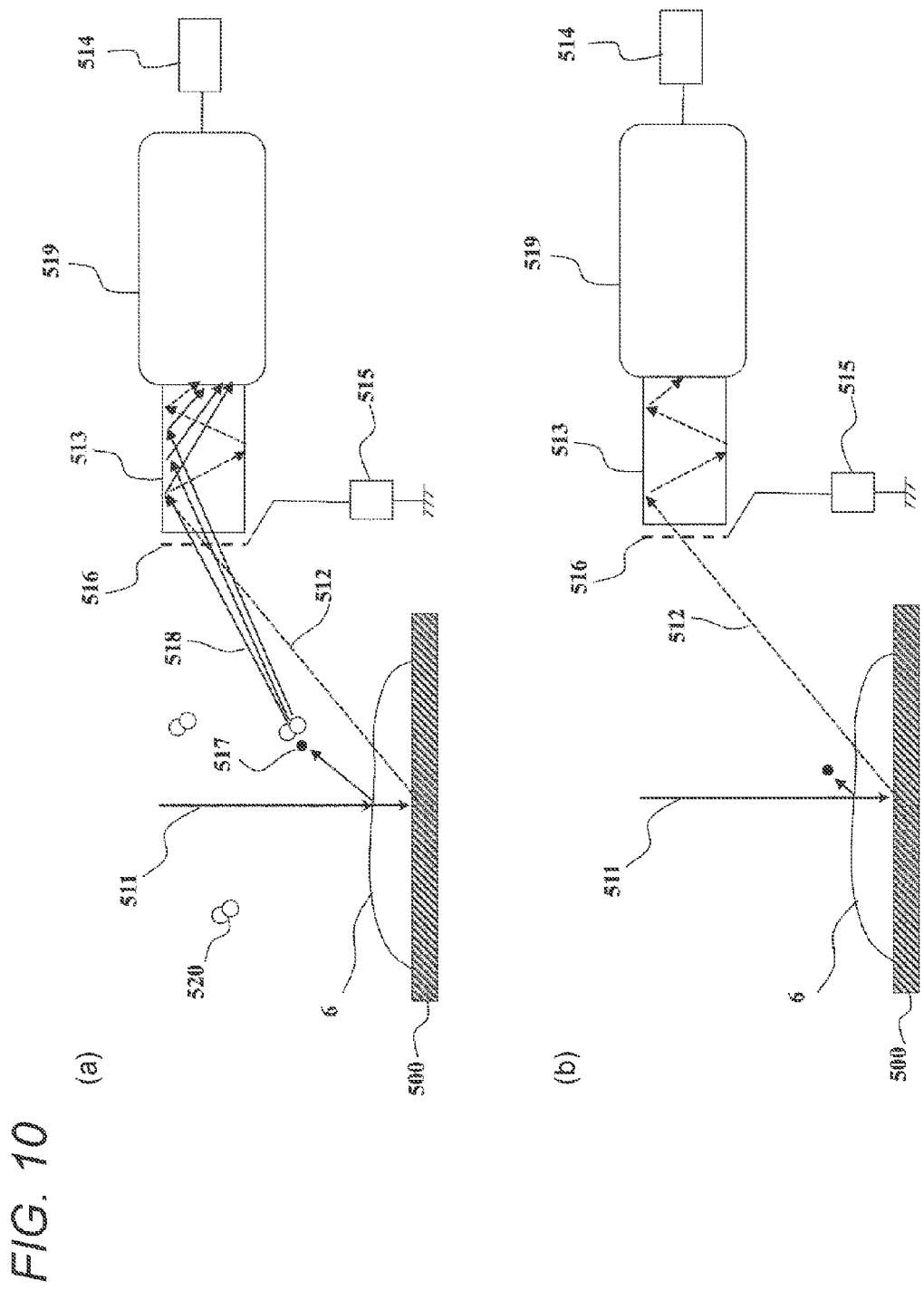
FIGS. 10(a) and 10(b) are explanatory diagrams for detecting the transmitted charged particle from the detection element.

In the above description, the method of switching the transmission image and the surface image by changing the voltage of the electrode 516 has been described. Meanwhile, the transmission image and the surface image can be switched by changing the amount of the gas molecule 520. This state is illustrated in FIGS. 10(a) and 10(b). An introduction gas amount through a gas introduction port 27 described below is adjusted in a state where the voltage of the electrode 516 is applied and the voltage is constant. In FIG. 10(a), the sample surface information can be acquired by the gas scintillation, similarly to FIG. 8(a). Meanwhile, as illustrated in FIG. 10(b), when the gas introduction through the gas introduction port 27 is stopped and the gas molecules near the sample are decreased, the gas scintillation less occurs, and thus the signal caused by the sample surface is not acquired. However, the light from the detection element 500 is detected by a detector 519 in the state of FIG. 10(b), and thus the transmission image is acquired. In the case of the present configuration, the voltage applied to the electrode 516 is constant, and thus the configuration of the power source 515 becomes extremely simple. Note that, obviously, both of a power source that varies the voltage of the electrode 516 and a control unit that controls the flow rate of the gas to be introduced near the sample may be provided, and the voltage of the electrode 516 and the degree of vacuum of the sample chamber may be controlled at the same time.

<Description of Device>

Figure 11:
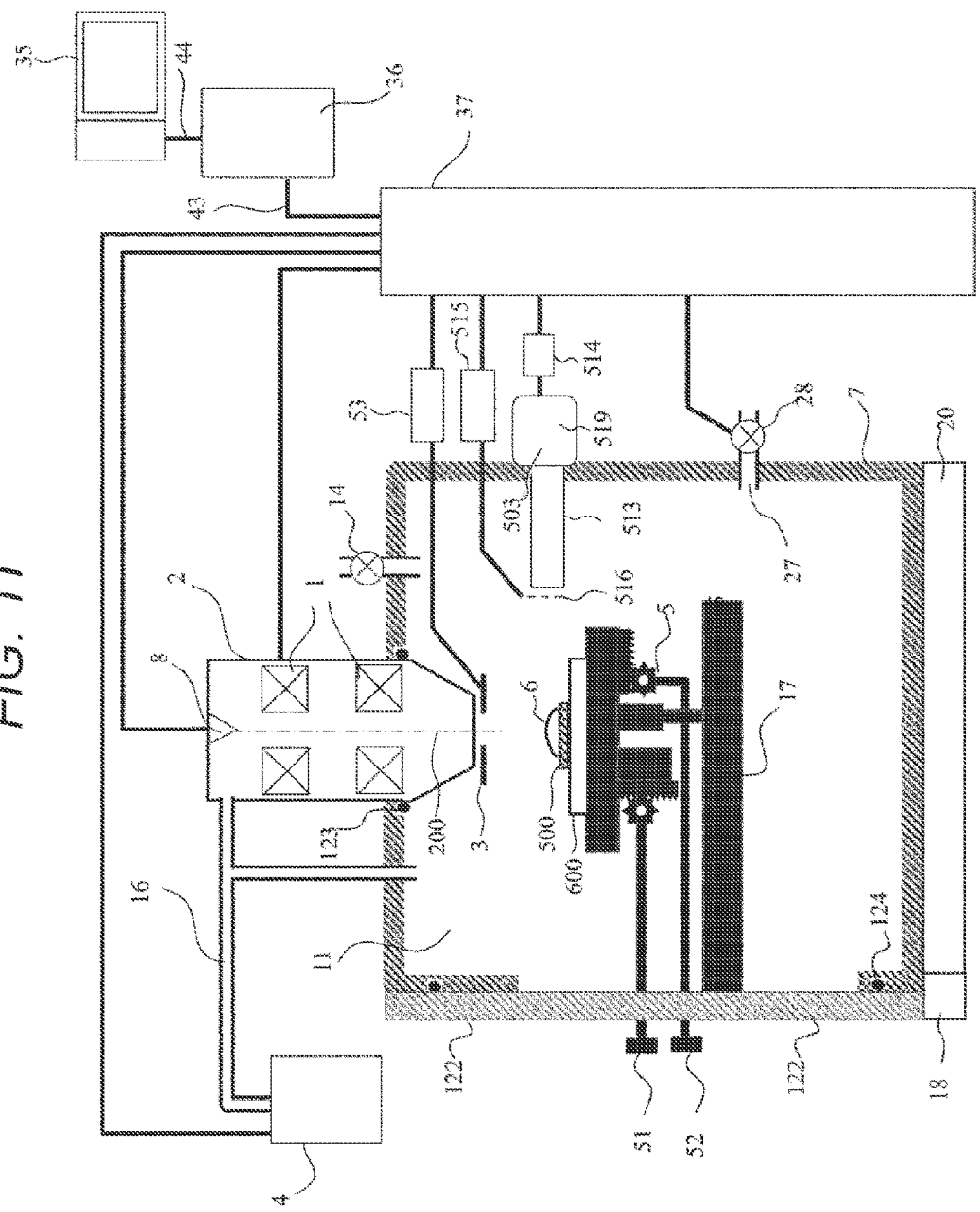
FIG. 11 is a device configuration diagram in a first embodiment.

Here, FIG. 11 illustrates a device obtained by mounting the sample table of the present embodiment in a typical charged particle beam device. A charged particle microscope is mainly configured from the charged particle optical barrel 2, a housing 7 (hereinafter, may also be referred to as vacuum chamber) that supports the charged particle optical barrel with respect to a device installation surface, and a control system that controls the aforementioned elements. At the time of using the charged particle microscope, interiors of the charged particle optical barrel 2 and the housing 7 are vacuum evacuated by a vacuum pump 4. Start and stop operations of the vacuum pump 4 are also controlled by the control system. In FIG. 11, only one vacuum pump 4 is illustrated. However, two or more vacuum pumps 4 may be provided.

The charged particle optical barrel 2 is configured from charged particle source 8 that generates the primary charged particle beam, an optical lens 1 that focuses the generated charged particle beam and guides the beam to a lower portion of the barrel, and scans the sample 6 with the primary charged particle beam, and the like. The charged particle optical barrel 2 is arranged to protrude into the interior of the housing 7, and is fixed to the housing 7 through a vacuum sealing member 123. A detector 3 that detects the secondary charged particle (a secondary electron or a reflection electron) obtained by irradiation of the primary charged particle beam is arranged in an end portion of the charged particle optical barrel 2. The detector 3 may be arranged in any place, other than the illustrated position, as long as the place is within the interior of the housing 7.

The secondary charged particles such as the reflection charged particle and the transmitted charged particles are emitted from the interior or the surface of the sample by the charged particle beam having arrived at the sample 6. The secondary charged particles are detected by the detector 3. The detector 3 is a detection element that can detect and amplify the charged particle beam coming flying with the energy of several to several tens of keV. For example, the detector 3 may be a semiconductor detector made of a semiconductor material such as silicon or a scintillator that can convert the charged particle signal into light at a glass surface or an interior thereof.

The charged particle microscope of the present embodiment includes, as the control system, a computer 35 used by a user of the device, a higher control unit 36 that is connected with the computer 35 and performs communication, and a lower control unit 37 that controls a vacuum evacuation system, a charged particle optical observation system, and the like according to a command transmitted from the higher control unit 36. The computer 35 includes a monitor where an operation screen (GUI) of the device is displayed, and input means to the operation screen, such as a keyboard and a mouse. The higher control unit 36, the lower control unit 37, and the computer 35 are connected with communication lines 43 and 44.

The lower control unit 37 is a portion that transmits/receives control signals for controlling the vacuum pump 4, the charged particle source 8, the optical lens 1, and the like, and converts an output signal from the detector 3 into a digital image signal and transmits the digital image signal to the higher control unit 36. In FIG. 11, the output signal from the detector 3 is connected to the lower control unit 37 through an amplifier 53 such as a preamplifier.

In the higher control unit 36 and the lower control unit 37, an analog circuit, a digital circuit, and the like may me mixed, and the higher control unit 36 and the lower control unit 37 may be integrated into one unit. Note that the configuration of the control system illustrated in FIG. 11 is merely an example, and modifications of the control unit, valves, the vacuum pump, and communication wiring belong to the category of the charged particle beam microscope of the present embodiment as long as the modifications satisfy the functions intended in the present embodiment.

A vacuum pipe 16 with one end connected to the vacuum pump 4 is connected to the housing 7, and can maintain the interior of the housing 7 in a vacuum state. At the same time, a leak valve 14 for releasing the interior of the housing to the air is included, and can release the interior of the housing 7 to the air at the time of introducing the sample table to the interior of the device. The leak valve 14 may not be provided, or two or more leak valves 14 may be included. Further, the arranged portion of the leak valve 14 in the housing 7 is not limited to the place illustrated in FIG. 11, and may be arranged in another position on the housing 7.

The housing 7 has an opening portion in a side surface, and a cover member 122 and a vacuum sealing member 124 are provided to this opening portion to keep a vacuum airtight state of the interior of the device. The charged particle microscope of the present embodiment includes a sample stage 5 that moves the sample mounted on the sample table as described above in the interior of the housing 7 to change the positional relationship between the sample and the charged particle optical barrel. The above-described light-emitting member or the sample table including the light-emitting member is attachably/detachably arranged to the sample stage 5. A support plate 107 that serves as a base plate supported by the cover member 122 is attached, and the sample stage 5 is fixed to the support plate 107. The sample stage 5 includes an XY drive mechanism in an in-plane direction, a Z-axis drive mechanism in a height direction, and the like. The support plate 107 is attached to extend in the interior of the housing 7 toward a facing surface of the cover member 122. Spindles extend from the Z-axis drive mechanism and the XY drive mechanism, respectively, and are linked with an operation knob 51 and an operation knob 52 included in the cover member 122, respectively. The user of the device can adjust the position of the sample by operating these operation knobs. Further, as described below, a configuration to provide the optical microscope on the cover member 122 may be employed.

The sample table 600 provided with the detection element 500, or the detection element 500 as a sample table can be attachably/detachably arranged on the sample stage 5. The sample table 600 or the sample table having the function of the detection element 500 may be temporarily fixed onto the sample stage 5 by being arranged between protrusions (not illustrated) or the like, or by being stuck to the stage 5 with a double sided tape or the like. Accordingly, misregistration of the sample table can be prevented when the position or the angle of the sample is changed. As described above, the light is generated by the charged particle beam having reached at the detection element 500. The photodetector 503 that detects the light, and converts the light into an electrical signal and amplifies the signal is provided in the housing 7. As described above, the photodetector 503 is configured from the optical transmission member 513 that can transmit the wavelength range of the light emission from the sample table 500, the electrode 516 that can form the electric field between the sample 6 and the optical transmission member 513, and the optical amplifier 519 that can amplify the light. The optical amplifier 519 is, for example, a semiconductor detection element or a photo multiplier. The optical amplifier 519 may be arranged in the housing 7. However, in a case where the optical amplifier 519 cannot be housed in the housing 7 due to limitations of the size of the device, the optical amplifier 519 may be arranged outside the housing 7 if the light is transmitted to the optical amplifier 519 through the optical transmission member 513 with a relatively freely processable shape. The amplifier 514 for amplifying the output signal is connected to the optical amplifier 519 by wiring or the like, and the signal from the amplifier 514 is finally displayed on the screen of the computer 35 as an image through the lower control unit 37 by wiring or the like. Although not illustrated, an optical observation component such as a mirror may be arranged somewhere in the interior of the device so that a larger amount of the light from the sample table 500 or the like can reach the optical transmission member 513.

Further, the power source 515 that can apply the voltage is connected to the electrode 516, and the voltage of the power source 515 is controlled through the lower control unit 37. The voltage is controlled by an operation of the user through the screen of the computer 35. With such a configuration, whether detecting only the light emission from the detection element 500, or whether detecting mainly the light emission of the gas scintillation caused by the electric field between the sample 6 and the electrode 516 can be selected. These two detection modes respectively correspond to the image having the information of the sample surface and the image having the information of the sample interior. That is, as described below, by controlling the magnitude of the voltage to be applied to the electrode 516 on the screen of the computer 35, the information of the sample surface and of the sample interior can be switched.

The charged particle beam device of the present embodiment can detect the signal by both of the detector 3 and the detection element 500 at the same time. In doing so, for example, the detector 3 as the semiconductor detector or the like can acquire the signal by the reflection charged particle generated from the sample, and the photodetector 503 can acquire the interior information by the light caused by the transmitted charged particle and the surface information caused by the secondary charged particle. Whether acquiring the information of the reflection charged particle, the surface information, or the interior information can be switched on the screen of the computer 35. Further, the detector 3 and the photodetector 503 are separate detectors, and can acquire an image at the same time.

The degree of vacuum of the interior of the sample chamber 7 is controlled by opening/closing of a needle valve 28 of the air introduction port 27 to the sample chamber 7. In the present device, a space 11 of the sample chamber can be caused to be in a low vacuum state (several to several thousands of Pa) by opening the needle valve 28, and the space 11 can be caused to be in a high vacuum state (several Pa or less) by closing the needle valve 28. As described in FIGS. 8(*a*) and 8(*b*), when the voltage is applied to the electrode 516 in the low vacuum state where a gas such as the air is introduced into the interior of the space 11, the secondary charged particle 517 emitted from the sample and the gas molecule 520 repeat the collision, and the light (ultraviolet light/visible light) 518 is generated, and the information of the sample surface can be acquired in the photodetector 503. If the voltage of the electrode 516 is made small enough not to cause the light emission phenomenon of the gas scintillation, the light emission from the detection element 500 can be acquired, and thus the information of the sample interior can be acquired. Further, as another method, if the interior of the space 11 is caused to be in the high vacuum state, the light emission phenomenon of the gas scintillation does not occur, and thus the information of the sample interior can also similarly acquired. Here, switching of the operation mode of the photodetector 503 (that is, change of the voltage to be applied to the electrode or the control of the degree of vacuum) is performed in the higher control unit 36 and the lower control unit 37 by the user inputting an instruction through an interface of the computer 35. Note that the user interface will be described using FIG. 13. The charged particle beam device of the present embodiment can be operated in two modes including a "transmitted charged particle image mode" to generate the transmitted charged particle image based on the detection signal of the light from the detection element 500, and a "secondary charged particle image mode" to generate the secondary charged particle image based on the detection signal caused by the secondary charged particle from the sample. Further, the higher control unit 36 and the lower control unit 37 control the detector, the electrode, and the degree of vacuum, corresponding to the modes, and can switch the two modes. Obviously, the charged particle beam device can have other operation modes than these two modes.

Figure 12:
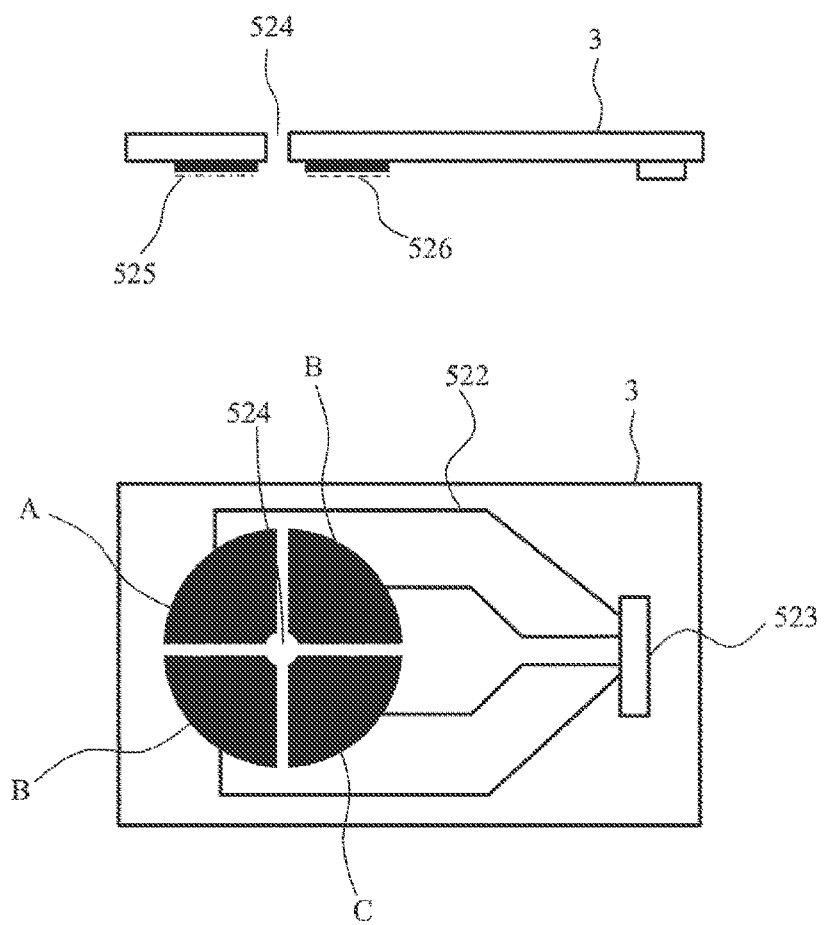
FIG. 12 is a detailed diagram of a detector.

Here, the detector 3 will be described in detail using FIG. 12. In the detector 3, the light-receiving surface of the detection element is divided into four elements A, B, C, and D, as illustrated in FIG. 12, for example. Note that the number of division and the division form are not limited to those illustrated in FIG. 12. Wiring 522 is connected to each of the divided elements, and signals from the elements are output to a connector 523. That is, in this case, although the detection surface is divided into four, the signals from these four detection surfaces are put together to the connector 523 and output to an outside. From that perspective, the detector 3 can be said to be "one detector" even if the detection element is divided into four.

A primary charged particle beam passing hole 524 is arranged in the center of the detector 3. The detector 3 is arranged such that the center of the primary charged particle beam passing hole 524 is matched with an optical axis 200 of the charged particle beam. In a case where the detection element is a semiconductor detector made of a semiconductor, the light emitted from the detection element 500 may be detected at the same time with the reflection charged particle beam from the sample. Therefore, an opaque film 525 that can transmit the reflection charged particle beam from the sample without transmitting the light to the detection element surface of the detector 3, or the like may be provided. Energy of the reflection charged particle beam is nearly equal to irradiation energy of the primary charged particle beam. The opaque film 525 is, for example, a metal film. Typically, the energy of the reflection charged particle beam is about several to several tens of kV. Therefore, to transmit the reflection charged particle beam and not to transmit the light, the thickness of the opaque film 525 is favorably from several tens to several hundreds of nm.

Further, as another example, there is a case of not detecting the reflection charged particle beam and detecting only the light emission from the detection element 500. In this case, a transparent film 526 that is transparent to the light from the detection element 500, and does not transmit the reflection charged particle may be arranged on the detection element surface of the detector 3. Not to transmit the reflection charged particle beam from the sample, the thickness of the transparent film 526 is favorably from several hundreds of nm to several tens of μm. For example, the opaque film 525 is arranged on the surfaces of the detection elements A and C, and the transparent film 526 is arranged on the surfaces of the detection elements B and D. In this example, the detection elements A and C serves as the light-receiving surface that detects the reflection charged particle, and the detection elements B and D serves as the light-receiving surface that detects the light from the detection element 500.

Figure 13:
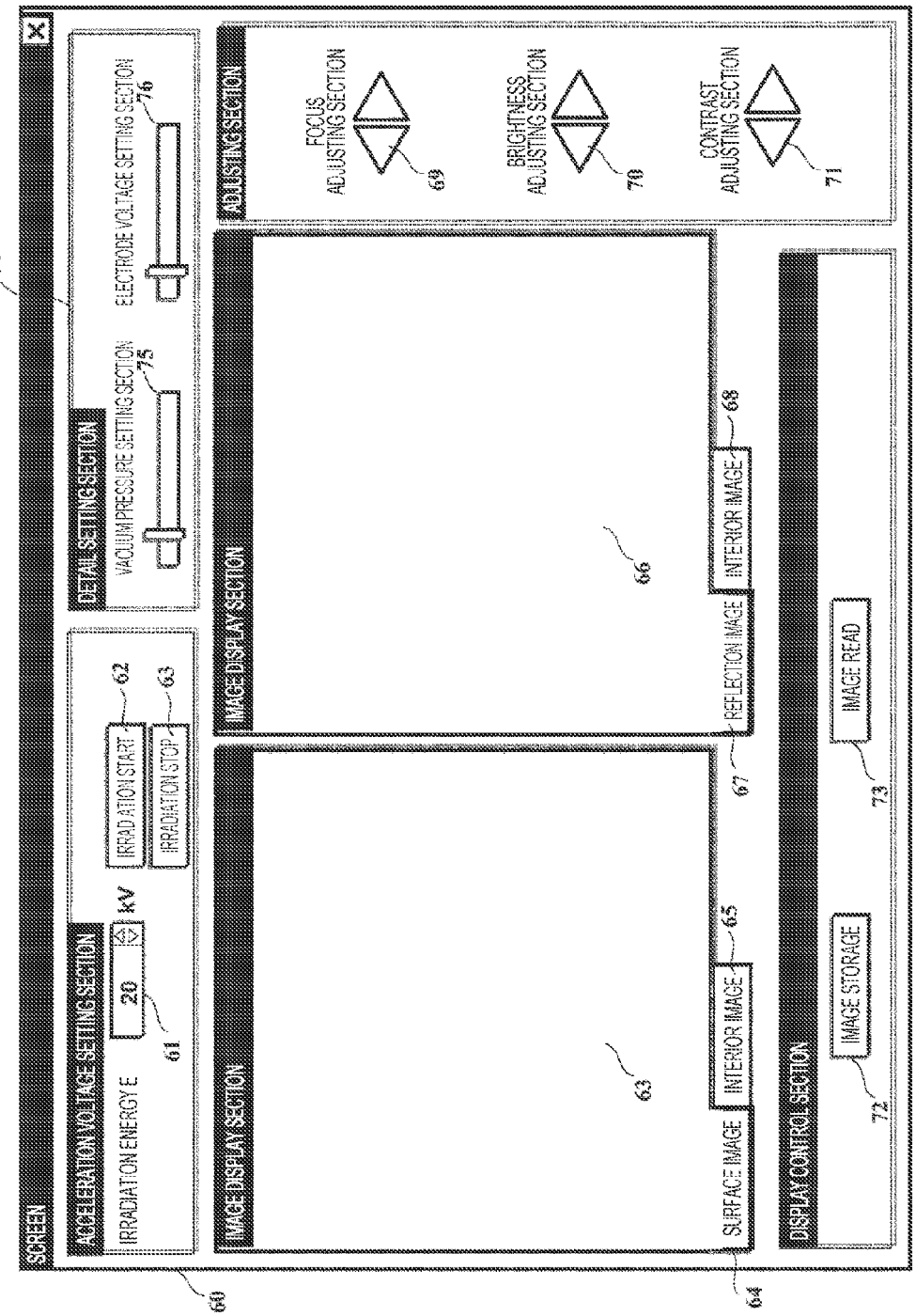
FIG. 13 is a detailed diagram of the detector.

According to this configuration, the reflection charged particle signal from the sample can be acquired from the signals from the detection elements A and C, and the signal having the information of the transmitted charged particle can be acquired from the signals from the detection elements B and D. The signal caused by the reflection charged particle is a signal that reflects form information of the sample, and the signal caused by the transmitted charged particle is a signal that reflects the interior information of the sample. Note that the form information of the sample is information configured from the charged particle beam that has entered the sample, has been back-scattered by substance existing near the surface, and has returned to the detector 3. Therefore, by acquiring these signals at the same time, the reflection charged particle image in which the form information of the sample is emphasized and the transmitted charged particle image in which the interior information of the sample is emphasized can be generated at the same time. The image signal displayed on the screen of the computer 35 can be controlled by the lower control unit 37. The user may input an instruction through the interface of the computer 35 as illustrated in FIG. 13. By use of the detector illustrated in FIG. 12, the charged particle beam device of the present embodiment can be operated in two modes including the "transmitted charged particle image mode" to generate the transmitted charged particle image based on the detection signal of the light from the detection element 500, and a "reflection charged particle image mode" to generate the reflection charged particle image based on the detection signal caused by the reflection charged particle from the sample. The higher control unit 36 and the lower control unit 37 controls the signals from the light-receiving surfaces of the detector 3, corresponding to the respective modes, and generates images of respective types according to the detection signals of the light-receiving surfaces. These two modes can be operated at the same time, or may be able to be switched.

According to the present system, the signal caused by the reflection charged particle and the signal caused by the transmitted charged particle can be acquired by the same detector 3. Therefore, the present system is useful in terms of space saving in the device. Further, the transmitted charged particle image and the secondary charged particle image can be acquired without moving the stage and changing the position and angle of the sample. Accordingly, the same sample can be observed in the same field of vision or at the same angle. Therefore, comparison between the transmitted charged particle image and the secondary charged particle image can be relatively easily performed. Further, according to the present system, the signal caused by the reflection charged particle and the signal caused by the transmitted charged particle can be acquired at the same time. Therefore, the present system is especially effective in a case of observing the sample in a state that varies from hour to hour.

Note that, obviously, only the detector 3 can be used, in place of switching of the transmitted charged particle image and the secondary charged particle image in the photodetector 503.

<Operation Screen>

FIG. 13 illustrates an example of an operation screen. An operation screen 60 is displayed on a monitor of the computer 35. The operation screen 60 includes an irradiation energy E setting section 61 for controlling irradiation energy of the charged particle beam, a button 62 that starts irradiation, and a button 63 that stops the irradiation. Further, the operation screen 60 is made of a focus adjusting section 69 that changes a focus of the charged particle beam, a brightness adjusting section 70 that adjusts brightness of an image, a contrast adjusting section 71 that adjusts contrast of the image, and the like. Further, the operation screen 60 includes an image display area 63 and an image display area 66 that can display a microscopic image in real time. There may be one, or two or more image display areas. If there are two image display areas, the image display area 63 can display an output from the detector 503 and the image display area 66 can display an output from the detector 3 at the same time. Here, being able to display an image at the same time means being able to display an image acquired in real time on the screen, regardless of timing when the image is displayed. Note that an image stored in a memory portion in the computer 35 may be displayed on the area 63 or the area 66, or an output image from the photodetector 503 and an output image from the detector 3 may be displayed on different windows. Further, the operation screen 60 may include an image storage button 72 for storing an image and an image read button 73 for reading an image may be provided.

A detail setting section 74 for switching signals detected in the photodetector 503 is made of a vacuum pressure setting section 75 for setting a pressure in an interior of a sample chamber, and an electrode voltage setting section 76 for setting and inputting a voltage to be applied to the electrode 516. When the vacuum pressure and the electrode voltage are continuously changed in an analog manner, the transmission information and the surface information may be mixed. Therefore, an adjustment value may be changed in an analog manner like the slide bar as illustrated.

Note that when it is not necessary to mix the transmission information and the surface information, an operation to easily switch a mode by ON/OFF of a button may be performed, in place of the slide bar as illustrated. Alternatively, in a case of displaying an image signal from the photodetector 503, on the image display area 63, a mode switching section may be displayed on the image display area 63. For example, a function to automatically set the value of the electrode voltage setting section 76 when a surface image mode tab 64 is selected and display an image having the surface information on the image display area 63, and to lower the voltage of the electrode of the photodetector when an interior image mode tab 65 is pressed, acquire a light emission signal from the detection element 500, and display the transmission image on the image display area 63 may be provided. Further, in a case of displaying an image signal from the detector 3, on the image display area 66, the image based on the reflection charged particle and the image based on the transmitted charged particle can be selectively switched with similar tabs. That is, a function to display a reflection signal from the detection elements A and C where an opaque film 525 illustrated in FIG. 12 is arranged, on the image display area 66, when a reflection image mode tab 67 is pressed, and to display sample transmission information from the detection elements B and D where a transparent film 526 illustrated in FIG. 12 is arranged, when an interior image mode tab 68 is pressed, on the image display area 66 may be provided. As described above, the user selects, on the screen, the type of the image to be displayed, whereby to automatically switch the control mode of the detector, instead of inputting a control parameter, so that the user can easily switch the screen.

Note that the configuration of the display illustrated in FIG. 13 is merely an example, and modifications of display positions and display forms belong to the category of the charged particle beam microscope of the present embodiment as long as the modifications satisfy the functions intended in the present embodiment.

<Description of Optical Microscopic Observation>

Figure 14:
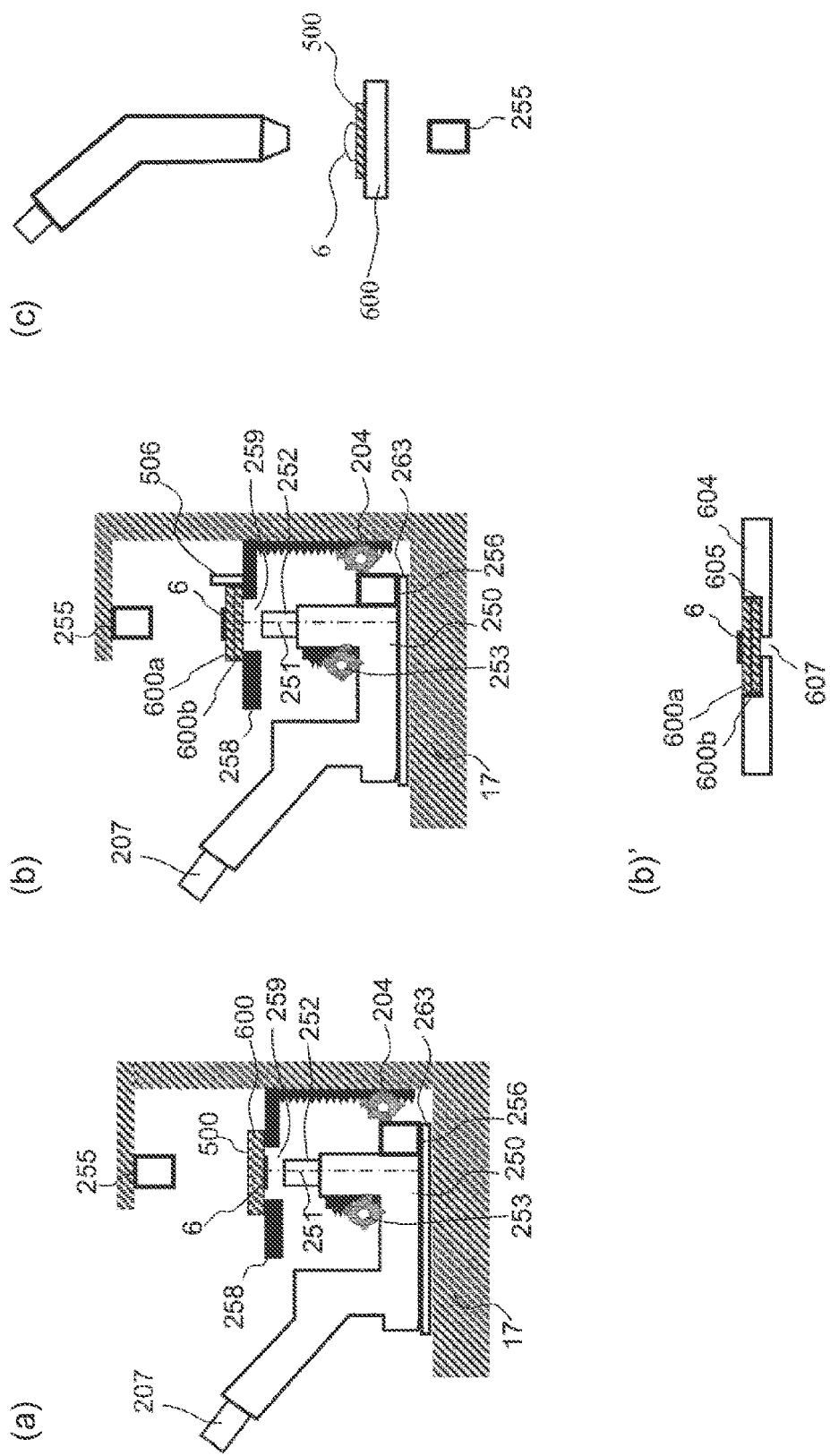
FIGS. 14(a) to 14(c) are explanatory diagrams for describing an observation method in the optical microscope.

FIGS. 14(*a*) to 14(*c*) illustrate a case of observing the sample mounted on the sample table 600 by the optical microscope. First, a structure of an optical microscope 250 will be described. The optical microscope 250 includes optical lenses such as an object lens 252. Microscope information via the optical lens is projected on an eyepiece 207. Alternatively, the microscope information may be converted into a digital signal by a CCD camera or the like, and displayed on a monitor (not illustrated).

The sample table 600 in the present embodiment is arranged on a sample stage 258. The sample stage 258 includes a drive mechanism 204 including an XY drive mechanism that can move the sample stage in a horizontal direction in FIGS. 14(*a*) to 14(*c*) and in a vertical direction on the paper surface with respect to an optical axis 251 of the optical microscope, and a Z axis drive mechanism that can change the distance from the object lens 252. The sample stage 258 includes an opening portion 259 to pass the optical axis 251 of the optical microscope, and the sample table 600 of the present embodiment is arranged on the opening portion.

The optical microscope 250 includes a light source that can generate the white light, the ultraviolet light, light with a controlled wavelength, or a photon beam such as a laser. The light source is a light source 255 for irradiating the sample table 600 with the light from above of the sample table 600 in FIGS. 14(*a*) to 14(*c*), or a light source 256 for irradiating the sample table 600 with the light from below. Note that the light source may be a light source in a room where the optical microscope 250 is arranged or sun light. The light amount of the light and the power source of ON/OFF of the light, of the light source, are supplied/controlled through a communication line and an electric wire (not illustrated). In FIGS. 14(*a*) to 14(*c*), the light sources are arranged in the two places described above. However, at least one light source may just be provided. Further, the light source may be arranged in a place other than the illustrated places. To change the observation magnification or a focal position, the optical microscope 250 includes an optical lens drive mechanism 253. By moving the object lens 252 in the direction of the optical axis 251 of the optical microscope by the optical lens drive mechanism 253, the sample 6 on the sample table 600 can be focused. Further, although not illustrated, the focus may be changed by moving the optical lens in the interior of the optical microscope 250 in the direction of the optical axis 251, instead of the object lens 252.

The light emitted from the light source 256 is emitted through the object lens 251 or its periphery through a mirror in the interior of the optical microscope 250, and reaches the sample. The photon beam reflected on the sample reaches the object lens 251. Accordingly, the optical signal emitted to the object lens 251 is imaged in the interior of the optical microscope 251, and the optical microscopic observation of the sample can be conducted with the eyepiece 207.

As described above, in a case where the detection element 500 is single crystal, when the light from the light source 255 passes through the sample, and then passes through the detection element 500, the light may be split into two by the double refraction phenomenon. As a result, when observation is performed with the eyepiece 207, the sample may be seen double. To prevent this, FIG. 14(*a*) illustrates the method of arranging the sample table 600 such that the sample 6 is positioned at the opposite side to the light source 255 with respect to the detection element 500, and irradiating the sample with the light of the light source 255 from the sample table side. In doing so, the light emitted from the light source passes through the detection element 500 as single crystal (here, it is fine if the light is split into two), and then the sample is irradiated with the light. The light having passed through the sample can then immediately enter the optical observation system. Therefore, the sample cannot be seen double.

Further, as another example, as illustrated in FIG. 14(*b*), by arranging another sample table 600*b* below a sample table 600*a* where the sample 6 is mounted, doubly refracted light may be put back again. There are a direction into which the double refraction is improved and a direction into which the double refraction is not improved, depending on the directions of crystal planes of the sample table 600*a* and the sample table 600*b*. Therefore, the sample table 600*b* needs to be arranged in a direction of cancelling the influence of the double refraction caused in the sample table 600*a*. Therefore, the sample stage 258 may include a protrusion 506 for easily aligning the directions of the sample table 600*a* and the sample table 500*b*. Further, a sample table 604 including a recessed portion 605 that can adjust the directions of the sample table 600*a* and the sample table 600*b* is prepared, as illustrated in FIG. 13(*b*)', and the sample table 604 may be mounted on the sample stage 258 of the optical microscope device 250. In the case illustrated in FIG. 14(*b*), the light source is arranged at the sample side with respect to the sample table, the sample table is irradiated with the light from the sample side, the light having been transmitted through the sample is caused to enter and is transmitted through the sample table 600*a* and the sample table 600*b* in order.

Alternatively, as illustrated in FIG. 14(*c*), an upright optical microscope having a light source below the sample 6 and the optical observation system above the sample can observe the sample upward, instead of the inverted optical microscope.

Second Embodiment

<Description of Observation of Atmospheric Pressure by Charged Particle Beam Device>

Next, a configuration in which the present embodiment is applied to a charged particle beam device that can perform observation under the atmospheric pressure will be described using FIG. 15. A charged particle beam device of the present embodiment is mainly configured from a charged particle optical barrel 2, a first housing (hereinafter, may also be referred to as vacuum chamber) 7 that supports the charged particle optical barrel with respect to a device installation surface, a second housing (hereinafter, may also be referred to as attachment) 121 used by being inserted into the first housing 7, a sample stage 5 arranged in the second housing, and a control system that controls the aforementioned elements. Basic configurations of the control system and the like are similar to those in FIG. 11, and thus detailed description is omitted.

At least one side surface of rectangular parallelepiped side surfaces of the second housing 121 is a release surface. Surfaces other than a surface where a diaphragm holding member 155 is installed, of the rectangular parallelepiped side surfaces of the main body portion 121, are configured from walls of the second housing 121. Alternatively, the second housing 121 itself may not have walls, and may be configured from side walls of the first housing 7 in a state of being incorporated into the first housing 7. The second housing 121 passes through the opening portion provided in the side wall of the first housing 7 and is inserted into the interior of the first housing 7, and has a function to store a sample 6 that is an object to be observed in a state of being incorporated in the first housing 7. The first housing 7 and the second housing 121 are fixed such that the second housing 121 is fixed to an outer wall surface of the first housing 7 at the one side surface side through a vacuum sealing member 126. The second housing 121 may be fixed to a side surface or an inner wall surface of the first housing 7, or a charged particle optical barrel. Accordingly, the entire second housing 121 is fit into the first housing 7. The opening portion of the first housing 7 can be most easily and simply manufactured by using an opening for carrying in/out the sample, which is originally provided in a vacuum sample chamber of the charged particle microscope. That is, if the second housing 121 is manufactured in accordance with the size of the originally opened hole, and the vacuum sealing member 126 is attached to a periphery of the hole, alteration of the device can be minimized. The second housing 121 can be detached from the first housing 7.

The side surface of the second housing 121 is a release surface communicating into the air space, the release surface having a size that can allow at least the sample to be taken in/out. The sample 6 stored in the interior of the second housing 121 is placed in an atmospheric pressure state, a slightly negative pressure state, or a desired gas type state during observation. Note that FIG. 15 is a device sectional view in a parallel direction to an optical axis, and thus illustrates only one surface of the release surface. However, the release surface of the second housing 121 is not limited to one surface as long as the release surface is vacuumed and sealed by the side surface of the first housing in a depth direction and a front direction of the paper surface of FIG. 15. At least one or more release surfaces may just be provided in a state where the second housing 121 is incorporated into the first housing 7. The sample can be carried in/out between the interior of the second housing (attachment) and the outside through the release surface of the second housing.

A diaphragm 10 that can transmit or pass the charged particle beam is provided to an upper surface side of the second housing 121. The diaphragm 10 is attachable/detachable to/from the second housing 121. A vacuum pump 4 is connected to the first housing 7, and can vacuum evacuate a closed space (hereinafter, referred to as first space) configured from the inner wall surfaces of the first housing 7, the outer wall surfaces of the second housing, and the diaphragm 10. Accordingly, in the present embodiment, while the first space 11 is maintained to be in a high vacuum state by the diaphragm 10, a space (a space surrounded by the diaphragm, the second housing 121, and a cover member 122 in FIG. 15, and hereinafter, referred to as second space 12) where the sample is held is maintained to be in the atmospheric pressure or gas atmosphere that is nearly equal pressure to the atmospheric pressure. Therefore, during the operation of the device, the charged particle optical barrel 2 side can be maintained to in the vacuum state, and the sample 6 and the above-described sample table can be maintained to be in atmosphere with the atmospheric pressure or predetermined pressure. The diaphragm 10 is held by the diaphragm holding member 155, and replacement of the diaphragm 10 can be performed by replacement of the diaphragm holding member 155.

Figure 16:
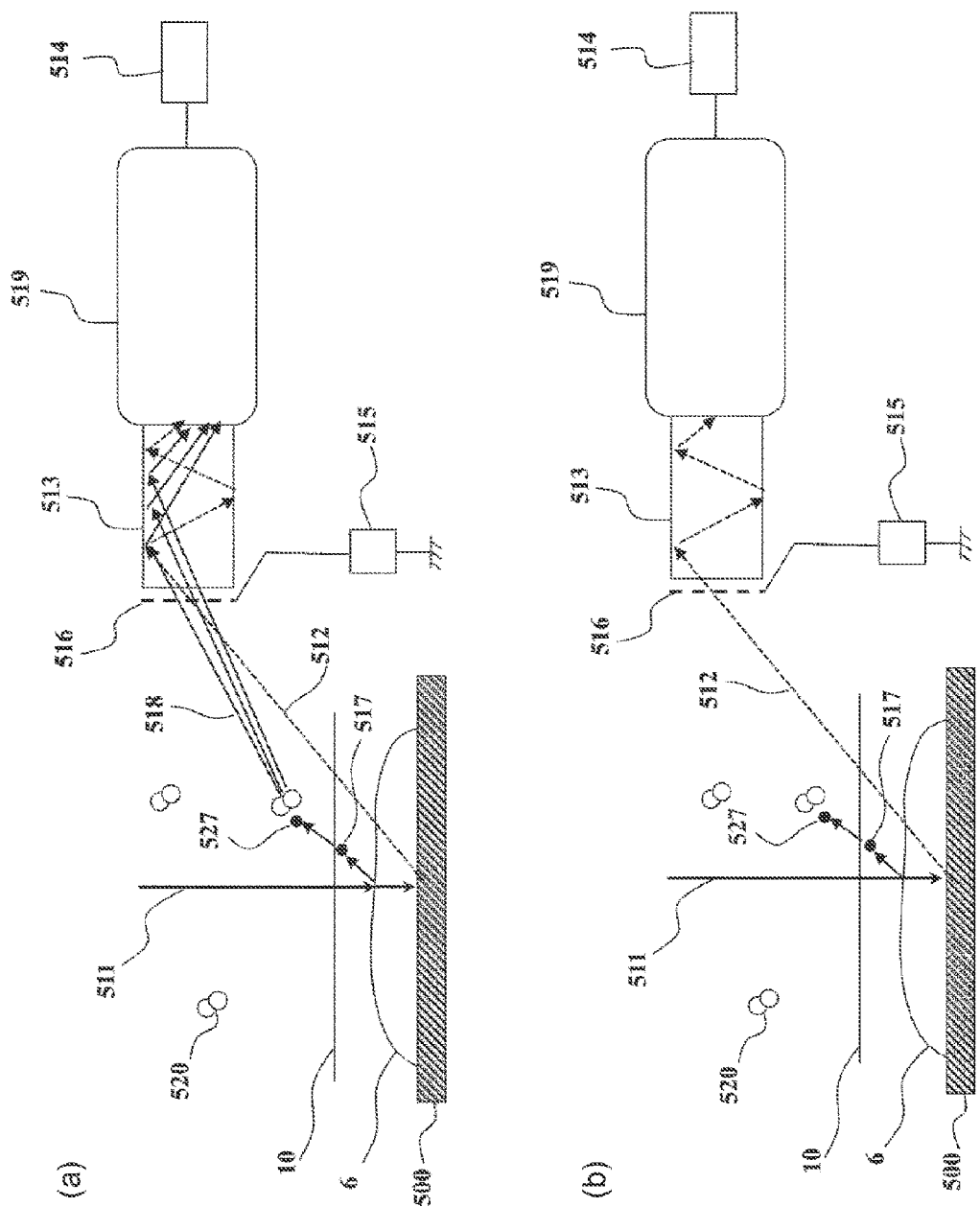
FIGS. 16(a) and 16(b) are explanatory diagrams for detecting a transmitted charged particle from a detection element.

Note that the degree of vacuum of the first space 11 can be adjusted, as described below using FIGS. 16(*a*) and 16(*b*). That is, the first space 11 can be caused to be in a low-vacuum environment by introducing gas molecules into an interior of the first space. The flow rate of the gas molecules is limited by a needle valve 28, for example, and the gas molecules can be introduced through an air introduction port 27.

In the case of the charged particle microscope of the present embodiment, the release surface that forms at least one side surface of the second housing 121 can be covered with the cover member 122. The cover member 122 is provided with the sample stage and the like.

The charged particle microscope of the present embodiment has a function to supply a substitute gas to the second housing 121 or a function to be able to form a pressure state different from the first space. A charged particle beam emitted from a lower end of the charged particle optical barrel 2 passes the first space 11 maintained to be in a high vacuum state, passes through the diaphragm 10 illustrated in FIG. 15, and enters the second space 12 maintained to be in the atmospheric pressure or in the slightly negative pressure state. That is, the second space is in a state where the degree of vacuum is worse than the first space (in the low degree of vacuum state). In the air space, the charged particle beam is scattered by gas molecules, and thus the mean free path becomes short. That is, if the distance between the diaphragm 10 and the sample 6 is large, a primary charged particle beam, or a secondary charged particle, a reflection charged particle, or a transmitted charged particle generated by irradiation of the primary charged particle beam cannot reach the sample, a detector 3, and a detection element 500. Meanwhile, a scattering probability of the charged particle beam is proportional to a mass number or density of the gas molecule. Therefore, if the second space is substituted by the gas molecules having a smaller mass number than the air, or vacuum drawing is slightly performed, the scattering probability of the charged particle beam is decreased, and the charged particle beam can reach the sample. Further, at least a passage of the charged particle beam in the second space, that is, the air in the space between the diaphragm and the sample may just be substituted by the gas, instead of the entire second space. As for the type of the substitute gas, gasses lighter than the air, such as nitrogen and vapor, improve an image S/N. A helium gas and a hydrogen gas having a smaller mass number further improve the image S/N.

For the above reason, the charged particle microscope of the present embodiment includes an attaching portion (gas introduction portion) of a gas supply tube 100 in the cover member 122. The gas supply tube 100 is connected with a gas cylinder 103 with a connection portion 102, and the substitute gas is introduced into the second space 12 through the gas supply tube 100. In the middle of the gas supply tube 100, a gas control valve 101 is arranged, and can control the flow rate of the substitute gas flowing in the tube. Therefore, a signal line extends from the gas control valve 101 to a lower control unit 37, and a user of the device can control the flow rate of the substitute gas through an operation screen displayed on a monitor of a computer 35. Further, the gas control valve 101 may be opened/closed by a manual operation.

The substitute gas is a light element gas, and is thus likely to stay in an upper portion of the second space 12 and is less easily substituted in a lower side. Therefore, an opening that communicates between an inside and an outside of the second space is provided in the cover member 122 at a lower position than the attached position of the gas supply tube 100. For example, in FIG. 15, the opening is provided in the attached position of the pressure adjusting valve 104. Accordingly, the atmospheric gas is pressed by the light element gas introduced through the gas introduction portion is exhausted through the lower opening. Therefore, the interior of the second housing 121 can be sufficiently substituted by the gas. This opening may also be used as a rough exhaust port described below.

The light element gas such as the helium gas may have large electron beam scattering. Further, in a case where the sample surface contains a large amount of moisture, the moisture needs to be slightly evaporated. In that case, a vacuum pump is employed as the gas cylinder 103, and then, vacuum drawing is slightly performed, so that the interior of the second housing can be caused to be in a very low vacuum state (that is, atmosphere with pressure close to the atmospheric pressure), and only the moisture on the sample surface can be evaporated. For example, a vacuum evacuation port is provided in the second housing 121 or the cover member 122, and the inside of the second housing 121 is vacuum evacuated. Following that, the substitute gas may be introduced. As for the vacuum evacuation in this case, high vacuum evacuation is not necessary and rough exhaust is enough because the atmospheric gas component remaining in the interior of the second housing 121 may just be decreased to a fixed amount or less.

In a case of observing a sample containing moisture, such as a biological sample, the state of the sample once placed in a vacuum state is changed because the moisture is evaporated. Therefore, it is favorable to perform observation before the moisture is completely evaporated, or to directly introduce the substitute gas from the air atmosphere. The release surface of the second housing 121 is closed with the cover member after the introduction of the substitute gas, so that the substitute gas can be effectively trapped in the second space.

As described above, in the present embodiment, the space where the sample is placed can be controlled to have an arbitrary degree of vacuum from the atmospheric pressure (about $10^5$ Pa) to about $10^3$ Pa. In a conventional so-called low vacuum scanning electron microscope, an electron beam column and a sample chamber communicate into each other, and thus if the degree of vacuum of the sample chamber is decreased and the pressure is caused to be pressure close to the atmospheric pressure, the pressure in the electron beam column is also changed, and it is difficult to control the sample chamber to have the atmospheric pressure (about $10^5$ Pa) to $10^3$ Pa. According to the present embodiment, the second space 12 and the first space 11 are separated with a thin film, and thus the pressure and the gas type of the atmosphere in the second space surrounded by the second housing 121 and the cover member 122 can be freely controlled. Therefore, the sample chamber can be controlled to have the atmospheric pressure (about $10^5$ Pa) to about $10^3$ Pa, which has been difficult to control. Further, not only observation at the atmospheric pressure (about $10^5$ Pa), but also observation of the state of the sample by continuously changing the pressure near the atmospheric pressure become possible.

If a three-way valve is attached to the position of the opening, this opening can be used as both of a rough exhaust port and an air leak exhaust port. That is, one of the three-way valve is attached to the cover member 122, another is connected to a rough exhaust vacuum pump, and the remaining one is attached to a leak valve, the above-described two-way exhaust port can be realized.

The pressure adjusting valve 104 may be provided, in place of the opening. The pressure adjusting valve 104 has a function to automatically open the valve when the interior pressure in the second housing 121 becomes 1 atm or more. By providing the pressure adjusting valve having such a function, the valve is automatically opened when the interior pressure becomes 1 atm or more and the atmospheric component such as nitrogen and oxygen can be exhaust to an outside of the device, and the light element gas can be filled in the device interior. Note that the illustrated gas cylinder or vacuum pump 103 may be provided to the charged particle microscope, or may be attached by the user of the device afterward.

The sample table provided with the detection element 500 can be placed on the sample stage 5 of the present charged particle beam device. In the state where the sample table is placed on the sample stage, the detection element 500 becomes a state of being placed at an opposite side of the diaphragm with respect to the sample. An arrangement configuration of a photodetector 503 and the like near the sample stage is similar to that in FIG. 11. In the case of this configuration, a transmitted charged particle beam signal in which shape change such as moisture evaporation caused by vacuum drawing and the like is decreased to a maximum extent can be acquired. Further, it is not necessary to perform vacuum drawing to cause the sample space to be in the high vacuum state, and thus a transmitted charged particle beam microscopic image of the sample on the sample table 600 can be acquired with extremely high throughput.

FIGS. 16(a) and 16(b) illustrate a principle that enables acquisition of surface information and interior information of the sample arranged in the air in the present configuration. In FIG. 16(a), the diaphragm 10 is irradiated with a secondary charged particle beam 517 from the sample, gas scintillation is generated by the secondary charged particle beam that has passed through the diaphragm 10 as it is or three-dimensional charged particle beam 527 generated by irradiating the diaphragm. 10 with the secondary charged particle beam and a gas molecule 520, and light is emitted. As a result, sample surface form information can be acquired by detecting caused light 518. Meanwhile, in FIG. 16(b), if no voltage is applied to an electrode 516, the secondary charged particle beam or the three-dimensional charged particle beam 527 generated in the diaphragm 10 does not emit light. That is, only light from the detection element 500 is acquired by a detector 519. Therefore, the transmission information can be detected by the detector 519. Note that, in the above description, the case in which the gas molecules are introduced into the first space 11, and the first space 11 becomes in the low vacuum state has been described. However, switching a mode to acquire the sample surface form information and a mode to acquire sample interior information is possible by switching the degree of vacuum of the first space 11, similarly to the method described in FIGS. 10(a) and 10(b).

Further, to acquire a sample interior image based on the transmitted charged particle and a sample form image based on the reflection charged particle at the same time in the atmospheric pressure, the detector 3 may just be used. That is, as illustrated in FIG. 11, the reflection charged particle beam reflected with the sample form information, after the beam has passed the diaphragm 10 and the sample 6 has been irradiated with the beam, passes through the diaphragm 10 again, and is detected by the detector 3 (detection elements A and C) in the interior of the first space 11. Further, the light emitted with the sample transmission information, after the light has passed the diaphragm 10, has passed through the sample 6, and the detection element 500 is irradiated with the light, passes through the diaphragm 10, and can be acquired by the detector 3 (detection elements B and D). That is, the sample form information and the sample interior information of the sample placed in the atmospheric pressure can be detected by the same detector at the same time.

Figure 15:
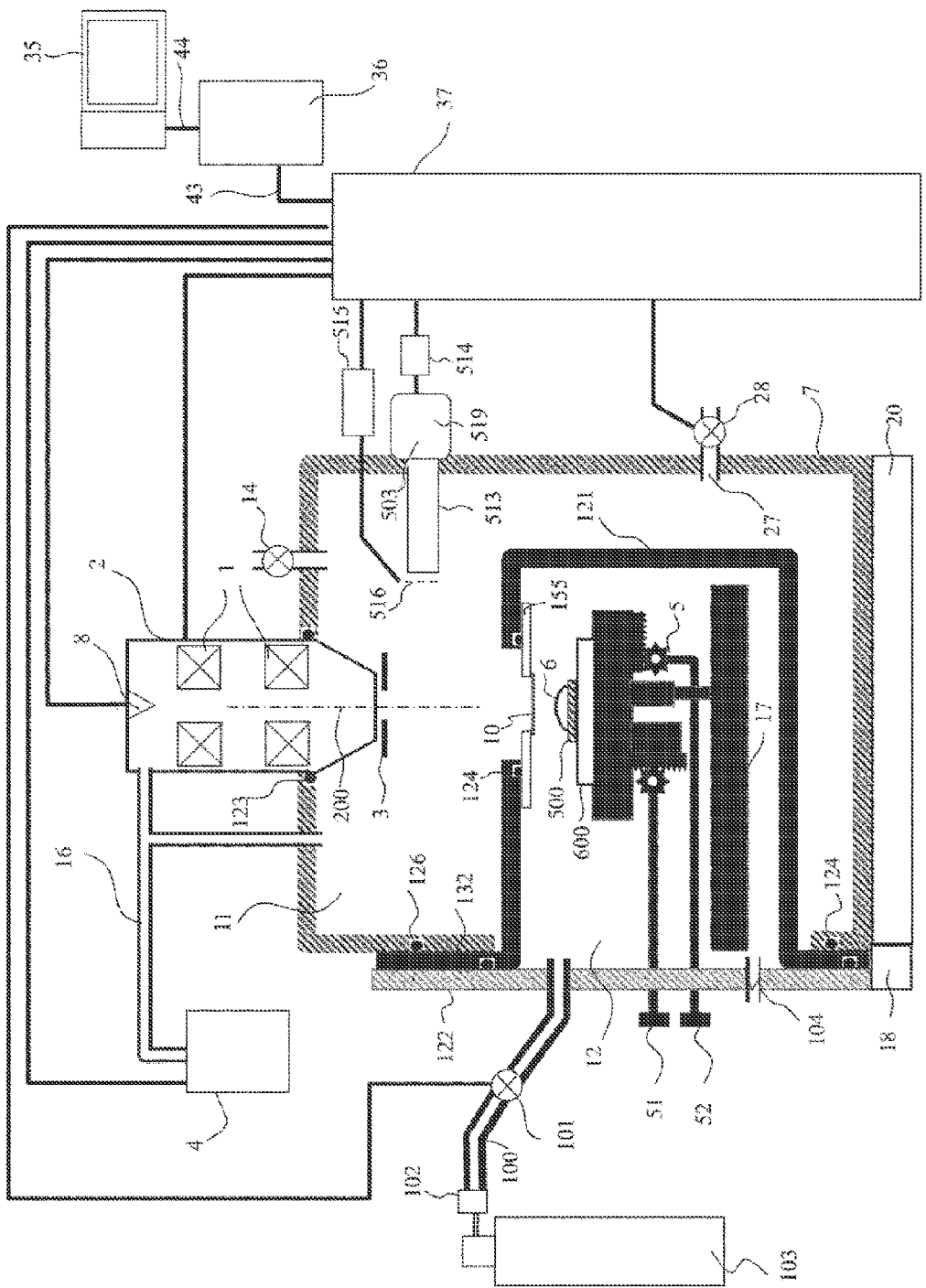
FIG. 15 is a device configuration diagram in a second embodiment.

Further, in the device of FIG. 15, the diaphragm holding member 155 and the diaphragm 10 can be detached. In this case, the second space 12 is vacuum evacuated by the vacuum pump 4 together with the first space 11. Therefore, a periphery of the sample 6 can be caused to be in a vacuum state. This state is the same as the configuration of FIG. 11, and thus the sample surface information using the gas scintillation in the photodetector 503 and the sample transmission information for acquiring the light emission from the detection element 500 can be observed by the same detector. Typically, a photo multiplier such as the photodetector 503 has a higher amplification rate than a semiconductor detector such as the detector 3. Therefore, an image acquired in the detector 503 has higher image quality. By use of the detector 3 as described above, the transmission information and the surface information in the air can be acquired.

Note that the present invention is not limited to the above-described embodiments, and includes various modifications. For example, the above-described embodiments have merely been described in detail for describing the present invention in an easy-to-understand manner, and are not necessarily limited to those including all of the above-described configurations. Further, a part of a configuration of a certain embodiment can be replaced with a configuration of another embodiment, and a configuration of another embodiment can be added to a configuration of a certain embodiment. Further, another configuration can be added to/deleted from/replaced with a part of a configuration of each of the embodiments. Further, a part or all of the above-described configurations, functions, processing units, processing means, and the like may be realized by hardware by being designed with an integrated circuit, for example. Further, the above-described configurations, functions, and the like may be realized by construction and execution of a program that realizes the functions by a processor.

The information such as the programs, tables, and files that realizes the functions can be placed in a recording device such as a memory, a hard disk, or a solid state drive (SSD), or a recording medium such as an IC card, an SD card, or an optical disk.

Further, the control line and the information line that are considered necessary for description have been described, and all of control lines and information lines necessary for a product are not necessarily described. In reality, it can be considered that almost all of the configurations are connected to one another.

REFERENCE SIGNS LIST 1 optical lens
2 charged particle optical barrel
3 detector
4 vacuum pump
5 sample stage
6 sample
7 housing
8 charged particle source
10 diaphragm
11 first space
12 second space
14 leak valve
15 release surface
16 vacuum pipe
17 stage support table
18 support column
19 cover member support member 20 bottom plate
27 air introduction port
28 needle valve
35 computer
36 higher control unit
37 lower control unit
43, 44, and 45 communication line
53 signal amplification circuit
60 operation screen
61 irradiation energy setting section
62 charged particle beam irradiation start button
63 image display area
64 tab of surface image mode
65 tab of interior image mode
67 tab of reflection image mode
68 tab of interior image mode
69 focus adjusting section
70 brightness adjusting section
71 contrast adjusting section
72 image storage button
73 image read button
100 gas supply tube
101 gas control valve
102 connection portion
103 gas cylinder or vacuum pump
104 pressure adjusting valve
107 support plate
51 operation knob
52 operation knob
121 second housing
122 cover member
123, 124, 125, 126, 128, and 129 vacuum sealing member
154 signal amplifier
155 holding member
156, 157, and 158 signal line
159 diaphragm holding base
200 optical axis of charged particle beam
204 drive mechanism
207 eyepiece
208 electrical connection portion
209 wiring
250 optical microscope
251 optical axis of optical microscope
252 object lens
253 optical lens drive mechanism
254 CCD camera
255, 256, and 257 light source
258 sample stage
259 opening portion
263 base or rail or guide
500 detection element
501 base
502 thin film
503 photodetector
506 protrusion
508 portion with high density
509 portion with low density
510 primary charged particle beam
511 primary charged particle beam
512 light generated from sample table
500 and 513 optical transmission member
514 signal amplifier
515 high-pressure power source
516 electrode
517 secondary charged particle beam
518 light having sample surface information
519 optical amplifier
520 gas molecule
521 table
522 wiring
523 connector
524 primary charged particle beam passing hole
525 opaque film
526 transparent film
527 emission electron from diaphragm
600 sample table
601 charged particle beam microscope
602 optical microscope
604 sample table
605 recessed portion
607 light passing hole
701 base
702 thin film
703 substitute substance

The invention claimed is:

1. A charged particle beam device comprising:
a charged particle optical barrel adapted to irradiate a sample with a primary charged particle beam;
a sample stage adapted to allow a light-emitting member or a sample table including the light-emitting member adapted to attach and detach therefrom, the light-emitting member emitting light by being irradiated with a transmitted charged particle having been transmitted through an interior of the sample;
a detector adapted to detect a signal from the sample; and
a control unit adapted to control the detector in a transmitted charged particle image mode to generate a transmitted charged particle image based on a detection signal of light from the light-emitting member, and in a secondary charged particle image mode to generate a secondary charged particle image based on a detection signal caused by a secondary charged particle or a reflection charged particle from the sample.

2. The charged particle beam device according to claim 1, wherein
the light from the light-emitting member and the detection signal caused by the secondary charged particle or the reflection charged particle from the sample are detected by the same detector.

3. The charged particle beam device according to claim 1, wherein
the transmitted charged particle image mode and the secondary charged particle image mode are switchable without moving the sample stage.

4. The charged particle beam device according to claim 2, further comprising:
an electrode adapted to cause an electric field between the detector and the sample,
wherein the transmitted charged particle image mode and the secondary charged particle image mode are switched by switching a magnitude of the electric field.

5. The charged particle beam device according to claim 1, wherein
the detector acquires the detection signal caused by the secondary charged particle from the sample by detecting light generated by a collision of the secondary charged particle with a gas existing near the sample.

6. The charged particle beam device according to claim 1, wherein
a degree of vacuum of a space where the sample is placed is changeable.

7. The charged particle beam device according to claim 1, wherein
the detector includes a light-receiving surface that detects the light from the light-emitting member and a light-receiving surface that detects the reflection charged particle from the sample.

8. The charged particle beam device according to claim 7, wherein,
at least one of the light-receiving surfaces of the detector includes a transparent film disposed thereon that does not transmit the reflection charged particle and transmits the light.

9. The charged particle beam device according to claim 7, wherein,
at least one of the light-receiving surfaces of the detector includes an opaque film disposed thereon that does not transmit the light and transmits the reflection charged particle.

10. An image generation method comprising:
irradiating a sample with a primary charged particle beam;
converting a transmitted charged particle into light, the transmitted charged particle having been transmitted through an interior of the sample and a light-emitting member of a sample table where the sample is placed having being irradiated with the transmitted charged particle;
detecting the light and generating a transmitted charged particle image based on a detection signal of the light; and
detecting a signal caused by a secondary charged particle or a reflection charged particle from the sample and generating a secondary charged particle image,
wherein the light from the light-emitting member, and the detection signal caused by the secondary charged particle or the reflection charged particle from the sample are detected by the same detector.

11. The image generation method according to claim 10, wherein,
the transmitted charged particle image and the secondary charged particle image are generated without moving the sample.

12. The image generation method according to claim 10, further comprising:
switching the light from the light-emitting member and the detection signal caused by the secondary charged particle or the reflection charged particle from the sample by switching a magnitude of an electric field between the detector and the sample.

13. The image generation method according to claim 10, further comprising:
acquiring the detection signal caused by the secondary charged particle from the sample by detecting light generated by a collision of the secondary charged particle with a gas existing near the sample.

14. The image generation method according to claim 10 comprising:
changing a degree of vacuum of a space where the sample is placed.

15. The image generation method according to claim 10, comprising:
detecting the light from the light-emitting member and the secondary charged particle or the reflection charged particle from the sample at a same time.

16. The image generation method according to claim 10, comprising:
irradiating the sample held in the sample table with light from a side of the sample table; and
irradiating the sample with light having been transmitted through the sample table.

17. The image generation method according to claim 10, comprising:
irradiating the sample held in the sample table with light from a side of the sample;
causing the light having been transmitted through the sample to be transmitted through a first light-emitting member on which the sample is placed; and
causing the light having been transmitted through the first light-emitting member to enter a second light-emitting member arranged in a direction to cancel an influence of double refraction caused in the first light-emitting member.

18. An observation system comprising:
a charged particle optical barrel adapted to irradiate a sample with a primary charged particle beam;
a sample table including a light-emitting member, or a sample table including the light-emitting member adapted to attach and detach therefrom, the light-emitting member emitting light by being irradiated with a transmitted charged particle having been transmitted through an interior of the sample;
a sample stage adapted to attach and detach with the sample table;
a detector adapted to detect a signal from the sample; and
a control unit adapted to control the detector in a transmitted charged particle image mode to generate a transmitted charged particle image based on a detection signal of light from the light-emitting member, and in a secondary charged particle image mode to generate a secondary charged particle image based on a detection signal caused by a secondary charged particle or a reflection charged particle from the sample.

* * * * *